US012811550B2

(12) United States Patent
Buono

(10) Patent No.: US 12,811,550 B2
(45) Date of Patent: Nov. 24, 2026

(54) TRIANGLE WAVE GENERATOR CIRCUIT WITH NOISE REDUCTION

(71) Applicant: Robert Buono, Mahwah, NJ (US)

(72) Inventor: Robert Buono, Mahwah, NJ (US)

(73) Assignee: CRESTRON ELECTRONICS, INC., Rockleigh, NJ (US)

( * ) Notice: Subject to any disclaimer, the term of this patent is extended or adjusted under 35 U.S.C. 154(b) by 216 days.

(21) Appl. No.: 18/769,086

(22) Filed: Jul. 10, 2024

(65) Prior Publication Data

US 2025/0047249 A1 Feb. 6, 2025

Related U.S. Application Data

(60) Provisional application No. 63/580,040, filed on Sep. 1, 2023, provisional application No. 63/513,164, filed on Jul. 12, 2023.

(51) Int. Cl.

*H03F 3/217* (2006.01)
*H03F 1/26* (2006.01)
*H03F 1/56* (2006.01)

(52) U.S. Cl.

CPC ............. *H03F 3/2173* (2013.01); *H03F 1/26* (2013.01); *H03F 1/565* (2013.01); *H03F 2200/03* (2013.01); *H03F 2200/171* (2013.01); *H03F 2200/351* (2013.01); *H03F 2200/372* (2013.01); *H03F 2200/78* (2013.01)

(58) Field of Classification Search

CPC .......... H03F 3/217; H03F 3/2171; H03F 3/38; H03F 3/393

See application file for complete search history.

(56) References Cited

U.S. PATENT DOCUMENTS

| | | | | |
|---|---|---|---|---|
| 5,973,368 A * | 10/1999 | Pearce | H03F 1/523 | 257/337 |
| 8,289,075 B2 * | 10/2012 | Kishii | H03F 3/217 | 330/51 |
| 2007/0176815 A1 * | 8/2007 | Kost | H03F 3/217 | 341/155 |

* cited by examiner

*Primary Examiner* — Henry Choe

(74) *Attorney, Agent, or Firm* — Mark W. Hrozenchik

(57) ABSTRACT

Described herein is a triangle wave generator circuit for use with a class D amplifier, the triangle wave generator circuit adapted to generate and output a triangle wave signal and comprising: a clock generating circuit adapted to provide a timing signal that generates a period of the output triangle wave; a first current source adapted to provide a first source current at a first magnitude; a first current sink adapted to sink a first sink current at about two times the first magnitude; a DC servo circuit adapted to adjust the first magnitude of the first source current based on a direct current (DC) voltage present in the output triangle wave signal so that the DC voltage on the output triangle wave signal is substantially eliminated; and an output filter circuit adapted to substantially reduce audio frequency noise in the output triangle wave, and generate the output triangle wave signal at a desired peak-to-peak voltage level based on the first source current and first sink current.

2 Claims, 20 Drawing Sheets

1300

1400

1500

1600

Capacitance Impedance v. Frequency

| | | |
|---|---|---|
| A | 20Hz | 22.1MΩ |
| B | 100Hz | 4.42MΩ |
| C | 1KHz | 442KΩ |
| D | 10KHz | 44.2KΩ |
| E | 20KHz | 22.1KΩ |
| F | 100KHz | 4.42KΩ |
| G | 1MHz | 442Ω |

1900

FIG. 19

$Z_C = 1/(2\pi FC)$ $C=336 \times 10^{-12}$ Farads (336pF)

Inductance Impedance v. Frequency

| | | |
|---|---|---|
| A | 20Hz | 125.66mΩ |
| B | 100Hz | 628mΩ |
| C | 1KHz | 6.28Ω |
| D | 10KHz | 62.8Ω |
| E | 20KHz | 125.66Ω |
| F | 100KHz | 628Ω |
| G | 1MHz | 6.28KΩ |

2000

FIG. 20

$Z_L = 2\pi FL$ $L=1 \times 10^{-3}$ Henrys (1mH)

TRIANGLE WAVE GENERATOR CIRCUIT WITH NOISE REDUCTION

PRIORITY INFORMATION

The present application claims priority under 35 U.S.C. § 119(e) to both U.S. Provisional Patent Application Ser. No. 62/427,730, filed Jul. 12, 2023 and U.S. Provisional Patent Application Ser. No. 62/580,040, filed Sep. 1, 2023, the contents of both of which are expressly incorporated herein by reference.

BACKGROUND OF THE INVENTION

Technical Field

The embodiments described herein relate generally to audio amplification, and more specifically to systems, methods, and modes for multi-channel amplification in class D amplifiers, and the generation of a substantially noise-free triangle wave signal by a triangle wave generator.

Background Art

Typically, one of the last components in an audio distribution chain, audio amplifiers amplify a low power audio signal to a level suitable for driving one or more loudspeakers. Multi-channel audio amplifiers are employed throughout structures to amplify more than one channel of audio.

As known to those of skill in the art, typical Class D amplifiers are a class of amplifier in which the audio signal modulates a pulse width modulated carrier signal to drive the output. Referring now to FIG. 1, a block diagram of class-D amplifier 100 is illustrated showing the different stages of operation of the amplifier. Input audio signal (input signal) 102 is input to pulse width modulator (PWM) comparator 104, which is part of modulator block 109, along with triangle wave 105 that has been generated by triangle waveform generator 103. In PWM comparator 104, input signal 102 is compared to triangle wave 105. Triangle wave (or sawtooth wave) 105 is typically a much higher frequency signal than input signal 102—usually ten or more times the highest expected frequency of input signal 102. Thus, if an audio signal of about 20 Hz to about 20 kHz is expected as input signal 102, then triangle wave 105 should be at least about 200 kHz. As its name implies, PWM comparator 104 typically includes a comparator, and compares the amplitudes of input signal 102 to that of triangle wave 105 to form a pulse width modulated output. That is, the width of each pulse will be dependent upon the amplitude of both input signal 102 and the amplitude of triangle wave 105, but at a frequency equal to that of triangle wave 105. The duty cycle is proportional to the amplitude of input signal 102. If both input signal 102 and triangle wave 105 are centered about 0 volts, then for a 0 volt input signal 102, the output duty cycle is about 50%, and if input signal 102 is about $V_{tmax}$, the maximum of triangle waveform 105, the duty cycle is about 100%. If input signal 102 is about $V_{tmin}$, the lowest voltage value of triangle wave 105, then the duty cycle is about 0%. FIG. 2 illustrates an example of a typical pulse width waveform generated in the above-described manner.

Referring now to FIG. 2, input signal 102 is shown as a roughly sinusoidal shaped signal with a frequency of about $1/20^{th}$ of that of triangle wave 105. Comparator stage output 106 is shown below input signal 102 that is super-imposed over triangle wave 105; the logic level "high" represents the times in which input signal 102 exceeds that of triangle wave 105. It can be seen that at points A and B, the duty cycle of comparator stage output 106 (the pulse width modulated signal) about 50%, and as input signal 102 swings closer to $V_{tmax}$ (at point C) and $V_{tmin}$ (at point D), the duty cycle of comparator stage output 106 changes from about 100% to about 0%, respectively.

As known by those of skill in the art, typical class D amplifiers with multiple channels typically comprise a global triangle ramp generator for use in all of the channels. A global analog buffer and a local analog buffer can be inserted between each channel and the triangle ramp generator.

Following PWM comparator 104, comparator stage output 106 is input to switching output stage (or power stage) 108, which is also part of modulator block 109. This device is typically comprised of an arrangement of switching transistors configured as a "half-bridge" or "full-bridge" and it amplifies the signal input to it, to create switching output signal 110. As can be seen in FIG. 1, switching output signal 110 is an amplified version of comparator stage output 106, and switches between only two states, the positive and negative power supply rail voltages (in the case of the "half-bridge" implementation), and the positive power supply rail voltage and ground (in the case of the "full-bridge" implementation). As known to those of skill in the art, the gain of the typical Class D amplifier modulator stage is set by the ratio of the power supply voltage, (or at least the power supply voltage that is available at switching output stage 108) and the peak-to-peak triangular wave voltage (triangle wave 105). For example, the gain of the modulator stage, of a half-bridge implementation with +/−50 VDC power supply rails, and a triangular wave voltage of 10 Vpp is 100V/10V=10.

Following switching output stage 108 is filter stage 112. In filter stage 112, the amplified PWM signal is passed through an (ideally) lossless low pass filter prior to the output device, speaker 116. The low pass filter removes the high frequency components of the PWM signal (switching output signal 110) and recovers the original audio signal, but in an amplified form, now referred to as amplified output signal 114.

Having briefly reviewed operation of a Class D amplifier in a fairly general sense, attention can now be directed to specific design issues with regard to Class D amplifiers. As those of skill in the art can appreciate, there are a multitude of design issues that need to be carefully considered with each new design of a Class D amplifier. Two such design considerations shall be considered herein. The first is isolation between channels, and the second is the safe operation over different load impedances.

Isolation between channels is a critical design consideration for multi-channel audio amplifiers. This isolation is typically expressed in decibels (dB) at a specific frequency, and further is typically a fairly small signal, thus a negative dB rating is typical, as the crosstalk signal is almost always much less than the original signal. Poor channel-to-channel isolation results in the audio signals from one channel being heard in another channel, which can result in poor channel separation. In a typical audio system, crosstalk can be audibly heard when volume levels are low (if there is a cross talk problem, which is not always the case). Notwithstanding its noticeability only when at low audio volumes, crosstalk, as mentioned above, can negatively affect channel separation, which could become more noticeable even at normal volume levels. Accordingly, high isolation (i.e., higher −dB crosstalk ratings) is desirable in multi-channel amplifiers.

One conventional solution to reduce channel-to-channel crosstalk includes the careful design of the printed circuit board (PCB) layout. Grounding may be used to eliminate common-impedance traces and mixing of signal and/or ground currents from more than one channel. Another scheme employed in conventional Class D amplifiers is differential signal routing instead of routing single-ended signals with a ground potential that is common to all channels. However, whenever a power, ground, or signal is common to more than one channel, it becomes a potential conveyer of crosstalk.

There are certain problems, however, with many of the conventional solutions to reduce crosstalk described above. Accordingly, it would be desirable to provide systems, methods, and modes for multi-channel amplification in class D amplifiers, and the generation of a substantially noise-free triangle wave signal by a triangle wave generator.

The second design consideration to be considered herein is safe operation of a Class D amplifier over different load impedances. In Class D amplifiers, as known to those of skill in the art, the power conversion efficiency of the amplifier is only slightly degraded as DC rail voltages are increased. This decrease in efficiency is attributable to increased switching losses. In contrast, however, on-state losses actually decrease as the DC rail voltages rise (due to reduction in MOSFET ON-TIME (duty-cycle). Thus, the Class-D topology already provides more freedom in the selection of DC rail voltages to power the half-bridge or full-bridge stage (i.e., switching output stage 108). An additional important effect in selecting DC rail voltages is that the audio output signal will be able to span the entire peak-to-peak range defined by the DC rail voltage presuming a full duty cycle range from 0% to 100%. Therefore, as those of skill in the art can appreciate, increasing the DC rails will allow greater output voltage, current, and power (for a given load impedance).

There are applications where it would be advantageous to set or adjust the DC rail voltages to different voltages in order to tailor the available output voltage, current, or power, to a particular load impedance. Further, it has been alleged to be advantageous to be able to change these DC rail voltages substantially continuously or instantaneously. The dynamic ability to modulate the DC rail voltages, at either audio frequency rates, or static levels set by manual switches, has been attempted by other, conventional systems. At least one disadvantage of this prior art method is increased complexity in power supply design, and the additional complexity in the means to modulate the power supply output voltage(s). Another disadvantage to this approach, is that the modulator gain of the Class-D amplifier is directly affected by the magnitude of the DC rails, as previously discussed, and therefore the open-loop gain of the Class-D amplifier channel is directly affected by the magnitude of the DC rails. This can cause instability in the negative feedback loop compensation of the amplifier, as will be discussed further below.

Accordingly, it would be desirable to provide systems, methods, and modes for multi-channel amplification in class D amplifiers, and the generation of a substantially noise-free triangle wave signal by a triangle wave generator.

SUMMARY

It is to be understood that both the general and detailed descriptions that follow are exemplary and explanatory only and are not restrictive of the different aspects of the embodiments.

An object of the embodiments is to substantially solve at least the problems and/or disadvantages discussed above, and to provide at least one or more of the advantages described below.

It is therefore a general aspect of the embodiments to provide a Class D amplifier that will obviate or minimize problems of the type previously described.

According to a first aspect of the embodiments, a triangle wave generator circuit for use with a class D amplifier is provided, the triangle wave generator circuit adapted to generate and output a triangle wave signal and comprising: a clock generating circuit adapted to provide a timing signal that generates a period of the output triangle wave; a first current source adapted to provide a first source current at a first magnitude; a first current sink adapted to sink a first sink current at about two times the first magnitude; a DC servo circuit adapted to adjust the first magnitude of the first source current based on a direct current (DC) voltage present in the output triangle wave signal so that the DC voltage on the output triangle wave signal is substantially eliminated; and an output filter circuit adapted to substantially reduce audio frequency noise in the output triangle wave, and generate the output triangle wave signal at a desired peak-to-peak voltage level based on the first source current and first sink current.

According to the first aspect of the embodiments, the output filter comprises: a capacitor with a first capacitor value that generates the output triangle wave signal at a desired peak-to-peak voltage level based on the first source current and first sink current; and an inductor with a first inductance value presenting a low impedance at audio frequencies while presenting a high impedance at the frequency of the output triangle wave signal that substantially shunts audio frequency noise to ground.

BRIEF DESCRIPTION OF DRAWINGS

The above and other objects and features of the embodiments will become apparent and more readily appreciated from the following description of the embodiments with reference to the following figures. Different aspects of the embodiments are illustrated in reference to figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

FIG. 13 is a substantially similar electrical/electronic equivalent to the combination of circuits of FIGS. 9-12 according to aspects of the embodiments.

FIG. 19 illustrates a first table that lists the results for several frequencies of interest for an equation of the capacitor impedance as shown in FIG. 17 according to aspects of the embodiments.

FIG. 20 illustrates a second table that lists the results for several frequencies of interest for an equation of the inductor impedance as shown in FIG. 18 according to aspects of the embodiments.

DETAILED DESCRIPTION

Figure 1:
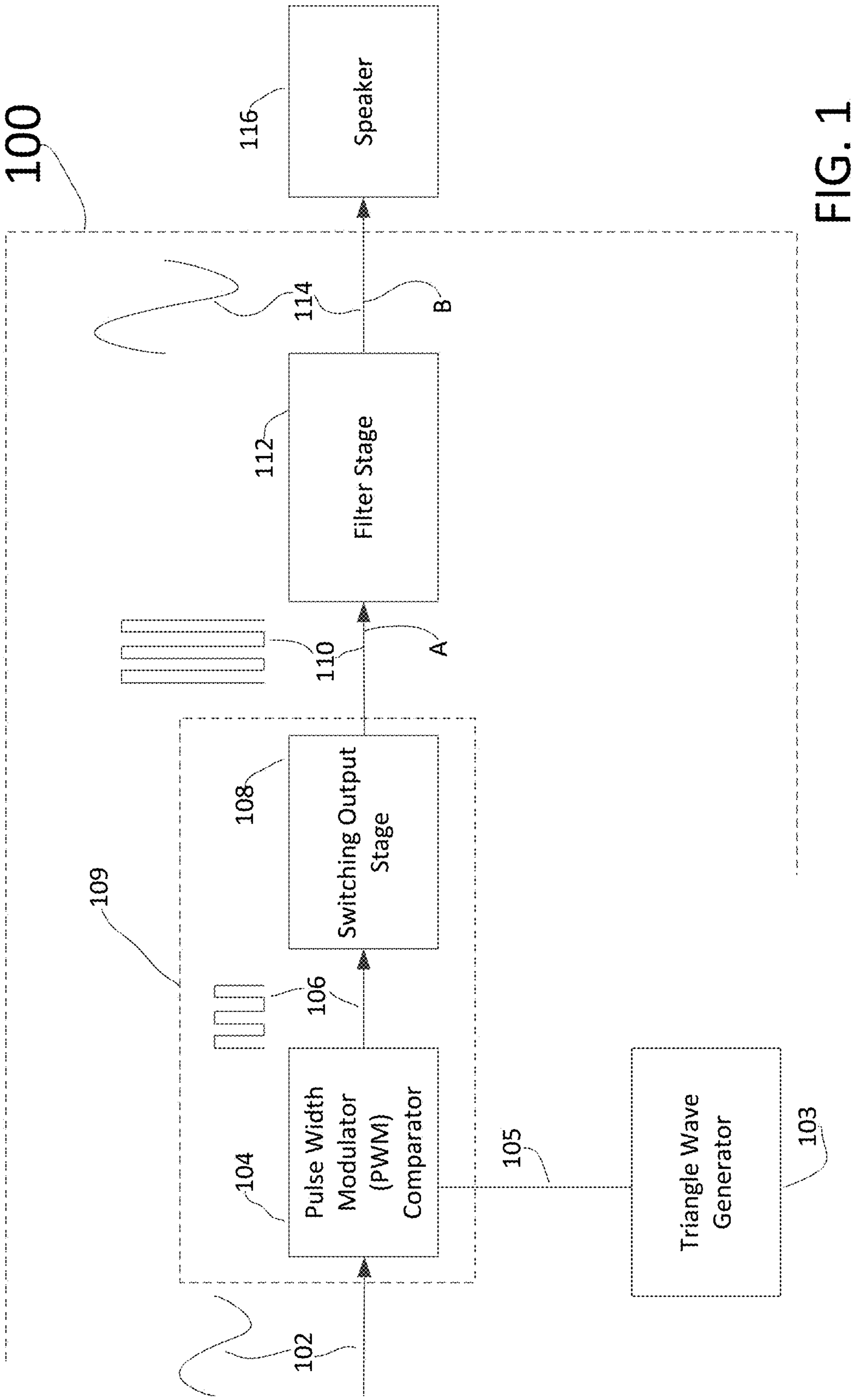
FIG. 1 Prior Art
FIG. 1 is a block diagram of a Class D amplifier.
Figure 2:
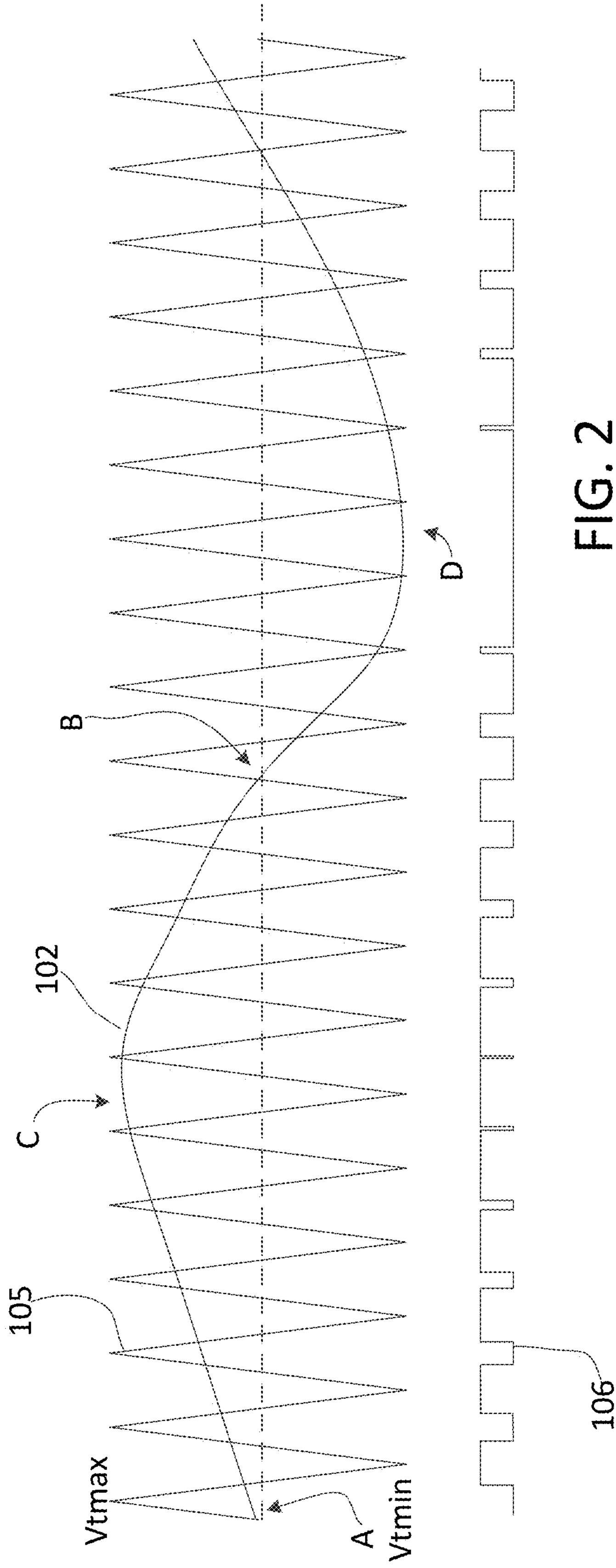
FIG. 2 illustrates a timing diagram of a triangle wave with an audio wave superimposed over it as inputs to a Class D amplifier modulator, and a resultant output therefrom.

The aspects of the embodiments disclose systems, methods, and modes for multi-channel amplification in class D amplifiers, and the generation of a substantially noise-free triangle wave signal by a triangle wave generator. Individual triangle wave generators in each audio channel with a single, fixed frequency digital clock for synchronization are employed. Additionally, the critical timing capacitor for each channel is connected directly to the ground reference of that channel. Accordingly, the isolation between channel grounds can be much higher relative to prior art audio amplifiers. The duty cycle can be limited by firmware and/or other means, and load sensing can be implemented to ensure safe operation.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular features, structures, or characteristics may be combined in any suitable manner in one or more embodiments.

The following is a list of the major elements in the drawings in numerical order.

100 Typical Class D amplifier
102 Input Signal
103 Triangle Waveform Generator
104 Pulse Width Modulator (PWM) Comparator
105 Triangle Wave Generator Output (Triangle Wave)
106 Comparator Stage Output
108 Switching Output Stage
108' Half-bridge Transistor Switching Output Stage
109 Modulator Block
110 Switching Output Signal
112 Filter Stage
114 Amplified Output Signal
116 Speaker
300 Substantially Noise-free Triangle Waveform Generator Circuit (Triangle Waveform Generator Circuit)
302 Digital Switching Frequency Control Circuit
303 Digital Clock Signal
304 DC Servo Circuit
306 Servo Circuit Capacitor
308 Servo Circuit Resistor
310 Servo Circuit Amplifier (Operational Amplifier (Op-Amp))
312 Triangle Waveform Generator Capacitor (Triangle Capacitor)
314 First Current Source
316 First Diode
318 Second Diode
320 First Current Sink
322 Low Noise Triangle Waveform Generator Output (Low Noise Triangle Waveform) Signal
350 Triangle Waveform Generator with Noise Immunity Circuit (Triangle Waveform Generator)
350' Triangle Waveform Generator with Noise Immunity Circuit, Alternate Embodiment (Triangle Waveform Generator)
400 Advanced Class D Amplifier (Advanced Amplifier)
404 Duty Cycle Limiting Signal Generator Circuit
406 Speaker Impedance Sensing Circuit
407 Low Noise Comparator Stage Output
407' Duty Cycle Limited (DCL) Low Noise Comparator Stage Output
408 Manual Speaker Impedance Selection Switch
409 Low Noise Switching Output Signal
410 Duty Cycle Limiting Signal
412 Duty Cycle Limiting Modulation Block
413 Low Noise Amplified Output Signal
414 Current Sense/Measurement
416 Voltage Sense/Measurement
418 Duty Cycle Limiting Circuit
502 Receiver Inverter
504 Receiver Non-inverter
506 Transistor Switch (First and Second)
700 Method for Operating Advanced Multi-Channel Class D Audio Amplifier
702-712 Method Steps of Method 700

Figure 11:
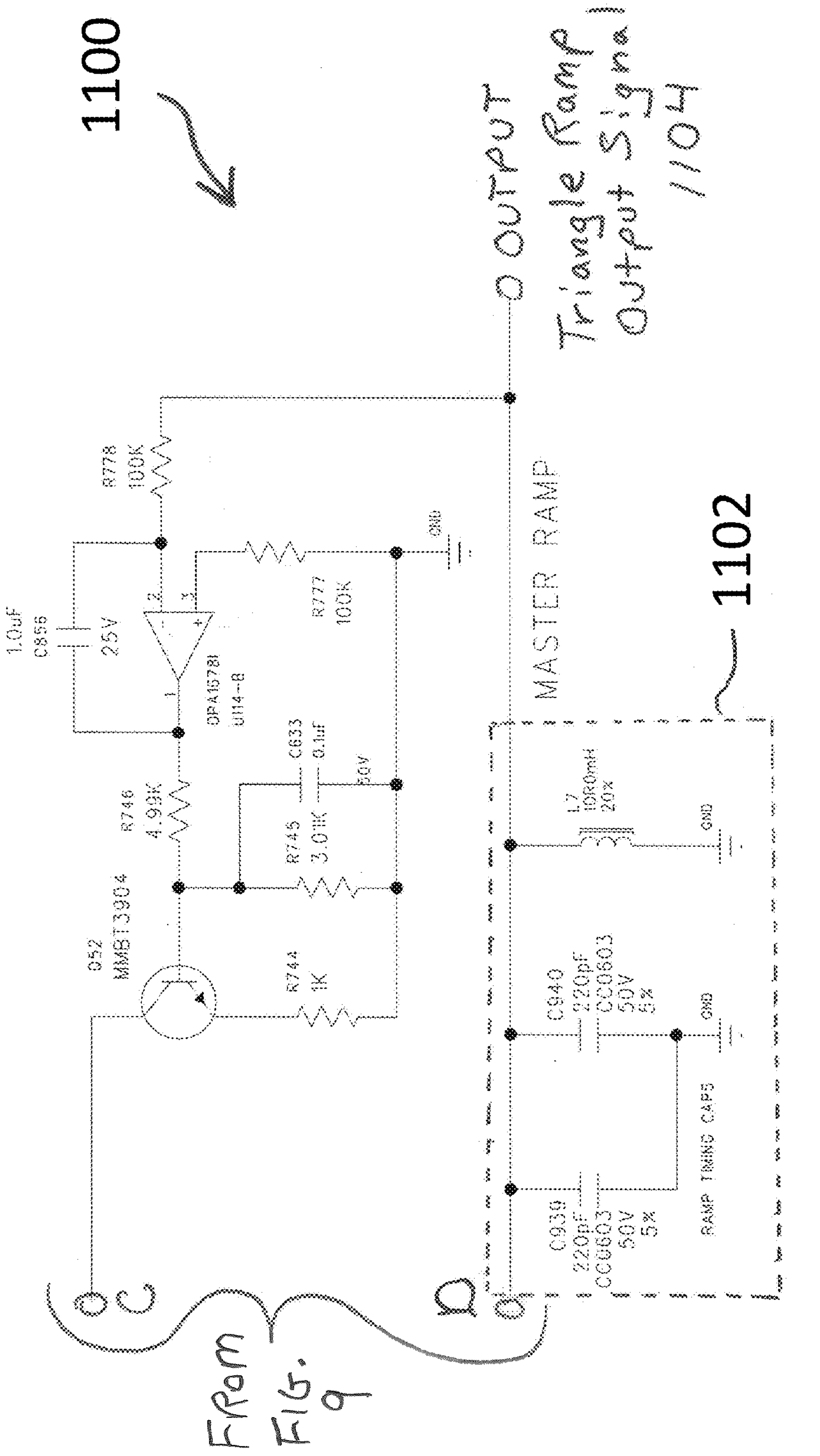
FIG. 11 illustrates a DC servo circuit used in a triangle wave generator circuit according to further aspects of the embodiments.
Figure 12:
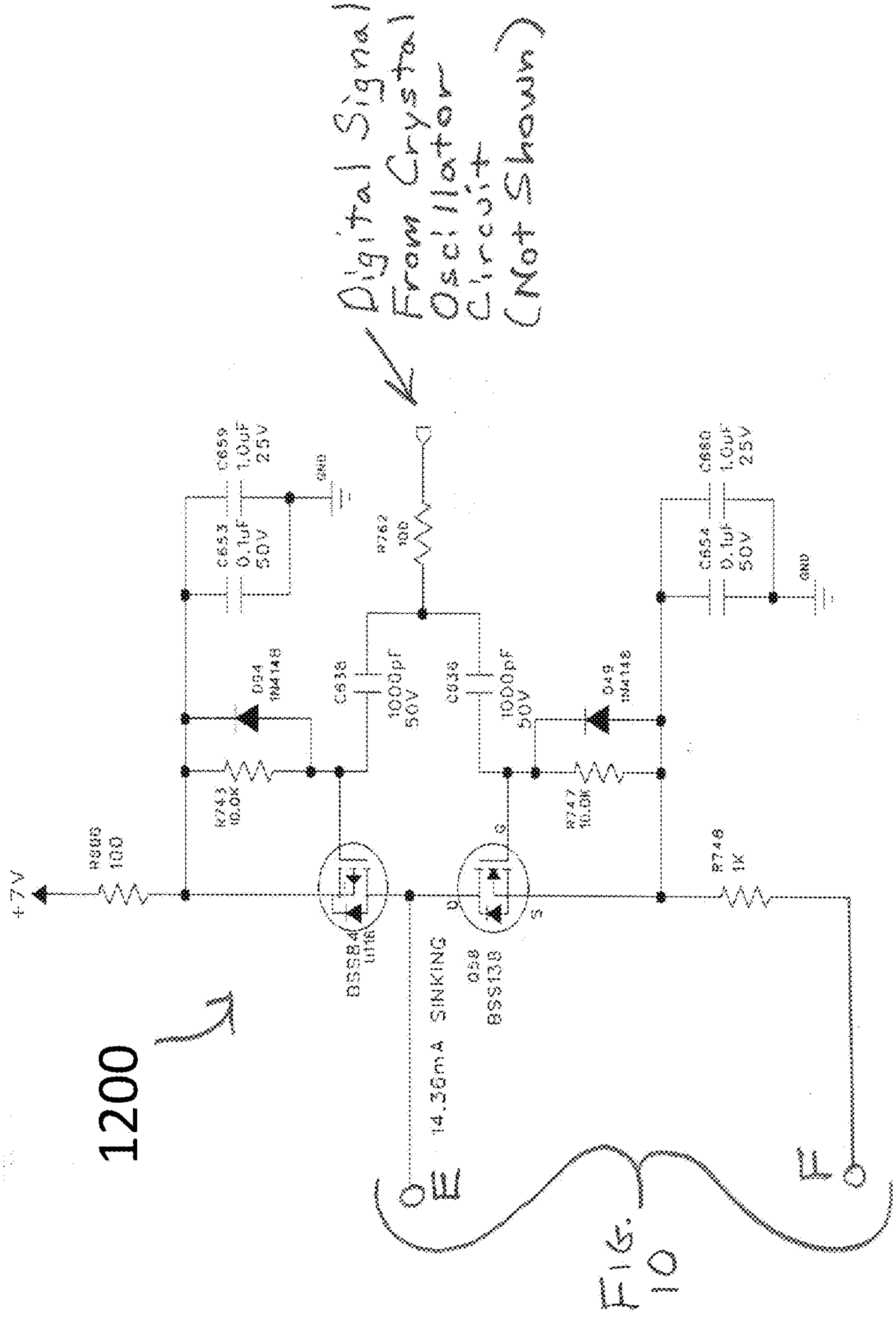

800 Method for Delivering a Duty Cycle Limited Signal to a Speaker Load in Advanced Class D Amplifier 400 Using a Half-Bridge Switching Output Stage 802-822 Method Steps for Method 800
900 First Current Source Circuit in Triangle Wave Generator
1000 First Current Sink Circuit in Triangle Wave Generator
1100 DC Servo Circuit
1102 Audio Noise Frequency Shunt Circuit
1104 Triangle Ramp Output Signal
1200 Square Wave Clock Signal Generator Circuit
1300 Simulation Circuit That Simulates the Operation of Circuits 900, 1000, 1100 and 1200 When Operated Together (Simulation Circuit)
1400 Triangle Ramp Output Signal as Generated by Simulation Circuit 1300 Simulated Noise Spectrum of Output of Simulation Circuit 1300 With
1500 Inductor L1 of Circuit 1300
1600 Simulated Noise Spectrum of Output of Simulation Circuit 1300 Without Inductor L1 of Circuit 1300
1700 Graph Illustrating Impedance of Parallel Capacitors Versus Frequency as Used in Output of DC Servo Generator Circuit 1100
1800 Graph Illustrating Impedance of Inductor Versus Frequency as Used in Output of DC Servo Circuit 1100
1900 Table of Calculation Results for an Impedance of a Capacitor as Used in the Circuit of FIG. 11 at Several Different Frequencies
2000 Table of Calculation Results for an Impedance of an Inductor as Used in the Circuit of FIG. 11 at Several Different Frequencies The following is a list of the acronyms used in the specification in alphabetical order.

Figure 3:
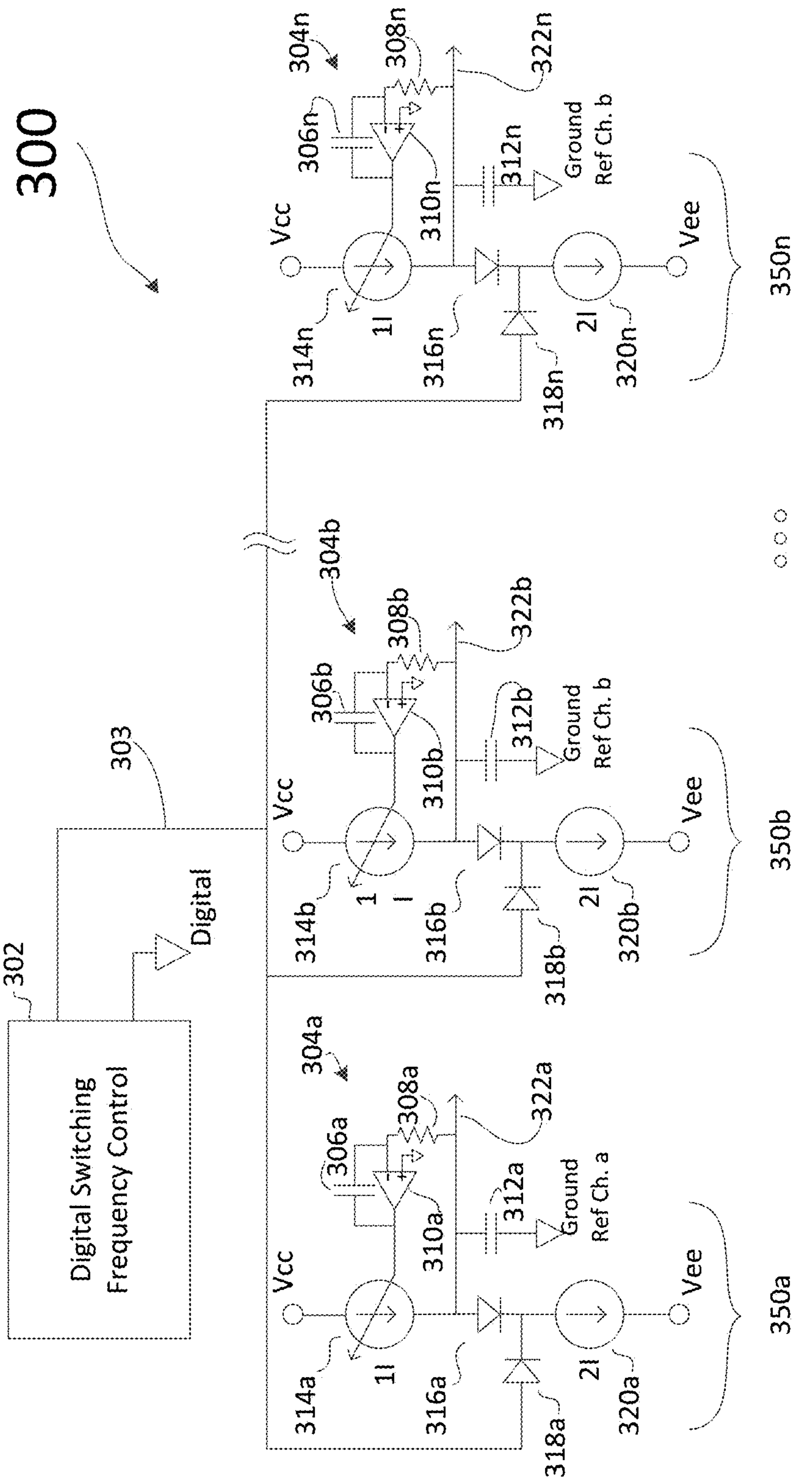
FIG. 3 is a schematic diagram of a portion of a multi-channel audio amplifier according to aspects of the embodiments.

A Amps
$A_{CL}$ Closed Loop Gain
$A_{PEAK}$ Peak Current Gain, Open Loop Gain
$A_{OL}$ Open Loop Gain
C Capacitor
dB Decibel
D Duty Cycle
DCL Duty Cycle Limiting/Limited
DC Direct Current
DSP Digital Signal Processor
EMI Electro-Magnetic Interference
FPGA Field Programmable Gate Array
Hz Hertz
I Current
$I_P$ Current Peak
kHz Kilohertz
kΩ Kilo Ohm
L Inductor
mH Milli-Henry
MHz Megahertz
μH Micro Henry
MOSFET Metal Oxide Semiconductor Field Effect Transistor
mΩ Milli Ohms
Ω Ohms
Op-Amp Operational Amplifier
P Power
PCB Printed Circuit Board
pF Pico Farad
PWM Pulse Width Modulation/Modulator
RMS Root Mean Square
t "On" Time of a Digital Binary Signal
T Period of a Signal (both analog and digital)
TWGC Triangle Wave Generator Circuit
$V_{cc}$ Positive Rail Voltage on Half-bridge Switching Stage
$V_{ee}$ Negative Rail Voltage on Half-bridge Switching Stage.
$V_I$ Input Voltage
$V_O$ Output Voltage
$V_P$ Voltage Peak
$V_{PP}$ Voltage Peak-to-Peak
$V_{RMS}$ Root-Mean-Square Voltage
$V_{tmax}$ Maximum Voltage of Low Noise Triangle Waveform 322
$V_{tmin}$ Minimum Voltage of Low Noise Triangle Waveform 322
$Z_c$ Capacitor Impedance
$Z_L$ Inductor Impedance FIG. 3 is a schematic diagram of a portion of a multi-channel Class D audio amplifier according to aspects of the embodiments. Shown in FIG. 3 is a portion of a Class D amplifier that can be used in place of triangle waveform generator 103 of FIG. 1. In FIG. 3 there is a single digital switching frequency control circuit (digital clock circuit) 302 that provides a common digital clock signal 303 to each of a plurality of triangle waveform generators 350 according to an embodiment. Though only one digital clock circuit 302 is shown in FIG. 3, those of skill in the art can appreciate that two or more such digital clock circuits 302 can be used, and they can be "slaved" to each to ensure that each digital clock signal 303 is lined up with the others. However, for purposes of this discussion, only one such digital clock circuit 302 shall be referenced and referred to herein.

The timing/integrating (triangle) capacitors 312 for triangle waveform generators 350 reside locally in each channel, and are referenced to the local ground for that channel. Accordingly, since triangle capacitors 312 are independent and referenced to each individual ground, they are not susceptible to crosstalk. It is known to those of skill in the art that any noise that is present on triangle capacitors 312 can adversely impact operation of any Class D amplifier.

As shown in FIG. 3, there are several different channels of triangle waveform generator 350*a-n*. Each of the several different channels of triangle waveform generator 350*a-n* can implement aspects of the embodiments that can substantially reduce or eliminate noise in the triangle waveform generator, and hence the amplified audio signal. A substantially noise-free amplified audio signal is a cleaner output audio signal and thus provides a more faithful audio amplification and reproduction. Since one (or a plurality of slaved) digital clocks are used for each of triangle waveform generators 350*a-n*, each will operate at about or substantially the same clock frequency of the digital clock.

Operation of each of triangle waveform generators 350*a-n* is as follows. Digital clock circuit 302 has a frequency of $f_d$, according to an embodiment, about 384 kHz, and this is the same frequency of triangle waveform generator 350*a-n*, $f_t$. Triangle capacitor 312 is the triangle wave timing capacitor, and any noise that might be present on triangle capacitor 312 will be present on triangle generator output, low noise triangle waveform signal 322. Thus, as can be appreciated by those of skill in the art, it is desirable to make this point in triangle waveform generator 350 as noise-free as possible to prevent any such noise from propagating into the amplified audio signal.

As those of skill in the art can appreciate, digital clock circuit 302 provides digital clock signal 303 that varies between a logic level one output ("high") and a logic level zero output ("low"), and this is input to second diode 318. When digital clock circuit 302 output is high, first diode 316 is reverse biased in regard to digital clock circuit 302 output, meaning that any noise that might be present on digital clock signal 303 cannot flow through it (because it is reverse biased). First current sink 320 is set to sink current at about 2×I, and this is provided by digital clock circuit 302, for each triangle waveform generator 350 that it is connected to. First current source 314, which is set to about 1×I, provides current to triangle capacitor 312, which then charges up, causing triangle waveform to rise in a linear fashion.

According to an aspect of the embodiments, first diode 316 isolates the triangle waveform generator output, low noise triangle waveform signal 322 when digital clock circuit 302 output signal is high because current cannot flow through first diode 316 when digital clock signal 303 output signal is a logic high. As noted above, each channel comprises first diode 316 and second diode 318, which are configured to isolate any noise or crosstalk that might be present on digital clock signal 303 from leaking into low noise triangle waveform signal 322, thereby making this signal substantially immune to crosstalk.

Triangle capacitor 312 continues to charge up while digital clock circuit 302 output signal is high, but when it goes low, then second diode 318 is turned off, and first current sink 320 begins to sink current at a rate of about 2×I (herein after referred to "2I"). First current sink 320 obtains the 2I current from both triangle capacitor 312, and from first current source 314, both of which provides about 1×I amount of current (hereinafter referred to "1I"). When current is drained from triangle capacitor 312, this causes the voltage across the capacitor to fall, which is the downward sloping portion of low noise triangle waveform signal 322.

As those of skill in the art can appreciate, the upward and downward slopes of the triangle waveform generator would be essentially equal if first current source 314 provided exactly 1I, and if first current sink 320 would sink exactly 2 I (because 1I of current would come from first current source 314, and 1I of current from capacitor 312). However, those of skill in the art can further appreciate that rarely, if ever, do analog circuits (or even digital circuits), approach equality in terms of sourcing/sinking voltages, currents, and the like. Consequently, error correction circuitry is purposely built into triangle waveform generator 350 according to an embodiment to counteract such "naturally occurring" error sources as discussed in the next section.

According to an aspect of the embodiments, DC servo circuit 304 serves to match the rising and falling voltage output of triangle waveform generator circuit 350 and to prevent a positive or negative DC voltage bias being formed on the output triangle waveform signal by compensating for purposely created current differences between first current source 314 and first current sink 320. That is, DC servo circuit 304 operates to maintain a balance between first current sink 320, which is designed to sink a current of about 2I, and first current source 314, which is designed to source a current of slightly less than 1I. The purposely created imbalance between the current source and sink must exceed the worst-case naturally occurring imbalance. Then, the DC servo circuit can be designed to source current only, as a way to maintain balance. The circuit topology used for generating this triangular ramp voltage allows great flexibility for improving crosstalk and noise performance. For example, increasing the peak-to-peak voltage swing of the triangular waveform generator will decrease the noise level of the amplifier, and its sensitivity to crosstalk-induced noise. Likewise, increasing the value of the triangle capacitor 312 will decrease noise sensitivity and crosstalk. The values of the 1I and 2I currents must be selected in conjunction with the value of triangle capacitor 312, and the switching frequency, in order to achieve the desired $V_{pp}$ voltage swing for the triangular ramp output waveform (low noise triangle waveform signal 322). As those of skill in the art can appreciate, other values of current sourcing and sinking can be used dependent upon the components used, desired accuracy, and other factors.

In accordance with an aspect of the embodiments, if the current sink level is set to 2I and the current source level is set to less than 1I, more current is being drained from triangle capacitor 312, on each half cycle of digital clock signal 303, than is being added to triangle capacitor 312 on each positive cycle of digital clock signal 303 and excess charge will be drawn from triangle capacitor 312; consequently, over subsequent cycles, low noise triangle waveform signal 322 begins to ride a gradually falling DC level (because of the current imbalance between first current source 314 (less than 1I) and first current sink 320 (2I)). The ability of DC servo circuit 304 to correct this imbalance by sourcing additional current into triangle capacitor 312 allows low noise triangle waveform signal 322 to have a 0V DC level. In the absence of the DC servo circuit 304, a falling or rising DC level of low noise triangle waveform signal 322 can seriously and negatively impact the expected output duty cycle.

According to an aspect of the embodiments, therefore, DC servo circuit 304 (which is comprised of servo circuit amplifier 310, servo circuit capacitor 306, and servo circuit resistor 308), could be designed to only increase or only decrease the current sourced by current source 314 as needed to keep the rising and falling slopes of the triangular waveform similar, or it could be designed to both increase or decrease the current sourced by first current source 314.

Accordingly, therefore, assuming an implementation whereby DC servo circuit 304 can both increase or decrease the current sourced by first current source 314, DC servo circuit 304 monitors the DC level at its input (which is low noise triangle waveform signal 322) and if it begins to swing low, i.e., a negative DC bias forces or drives low noise triangle waveform signal 322 downward, DC servo circuit 304 compensates by causing additional current to be sourced by first current source 314 (which can be seen as a variable current source) so that triangle capacitor 312 is properly charged and maintains a DC level of about 0 volts. Conversely, and according to further embodiments, if DC servo circuit 304 determines that low noise triangle waveform signal 322 is beginning to swing positive, i.e., a positive DC voltage bias, DC servo circuit 304 compensates by causing less current to be generated from variable first current source 314 so that triangle capacitor 312 is properly charged and maintains a DC level of about 0 volts. In one embodiment of DC servo circuit 304, operational amplifier (op-amp) 310 is used as an integrator to compare the DC value of the triangular waveform to a 0V reference voltage. The op-amp will source or sink current as necessary in order to keep the average DC value of the triangular waveform equal to the 0V reference voltage. Those of skill in the art will recognize how to use an op-amp as an integrator to accomplish this circuit function.

In the embodiment shown in FIG. 3, the switched current sources (314, 320), which source or sink current to triangle capacitors 312, reside locally. Each channel comprises a first current source 314 and a first current sink 320. According to another aspect of the embodiments, switched current sources 314 and current sink 320 can be located in a single position on the PCB and operate as current mirrors from a central current generator circuit block. Each set of current mirrors will be dedicated to feeding an individual channel. Sending the ramp signal as a current instead of a voltage reduces voltage noise susceptibility, and also allows the ramp signal to be referenced to each individual channel's ground reference, thus avoiding common impedances and ground loops.

Attention is now directed to a different aspect of operation of Class D amplifiers, the gain. All amplifiers have what is known as an open loop gain parameter; that is, $V_o/V_i=A_{OL}$. Typically, $A_{OL}$ is pretty large—sometimes 10,000 or even more. But, the open loop gain configuration of most amplifiers is non-linear, meaning that simply inputting a signal and expecting a linearly amplified output is hardly, if ever, realized. That is, the output is substantially distorted in terms of gain versus frequency and gain versus input amplitude, phase shift, and so on. Thus, it is the goal of circuit designers to linearize the gain of the amplifier such that the output is linearly related to the input in terms of gain versus frequency of the input signal, gain versus the amplitude of the input signal, and phase shift over the expected bandwidth, among other factors.

It is known by those of skill in the art that to obtain good linearization, what is typically done is to add negative feedback between the output and the input such that the gain of the amplifier is now properly characterized as a closed loop gain. It is also known that while negative feedback does provide the greatly needed linearization, it also reduces the gain from the very high numbers of the open loop condition (e.g., about 10,000, or even higher) to much lesser values in the closed loop configuration, $A_{CL}$, which can range from just above zero (a gain of 0.1 is an "amplifier" of less than unity, actually a signal-reducer or attenuator) to about 100 or even about 1000. The actual gain numbers are typically a product of values of passive components placed about the amplifier in specific configurations, as known to those of skill in the art.

Furthermore, it is recognized that when $A_{OL}$ is much larger than $A_{CL}$ ($A_{OL} \gg A_{CL}$), then the tolerance of the closed loop gain is controlled by the tolerances of the components that create the closed loop gain. The closed loop gain is typically determined by using simple resistors in a feedback loop. Therefore, very low tolerance resistors of 1% or even better can be used, and the tolerance of the closed loop gain can be controlled to within the same magnitude.

Based in part on the above discussion regarding open and closed loop gain, there are three types of gain control configurations that are typically used with Class D amplifiers. The first is the open loop gain. As discussed above, this is not typically used in Class D amplifiers, nor many others, because of its non-linearity's. The second type of gain control is a negative feedback loop closed loop system, wherein the feedback signal is taken before the output low pass filter. Referring again to FIG. 1, this point would be at point A. That is, a signal is fed-back from point A to an error amplifier (not shown in either of FIG. 1 or 4) that compares the feedback signal to the input signal 102. The output of the error amplifier is then input into PWM comparator 104, and this helps create a more linear output signal. As those of skill in the art can appreciate, this is relatively easy to accomplish as it precludes the additional phase shift of the L-C filter (typically used as filter stage 112). That is, the output signal has not been fed through the (typically) inductor-capacitor (L-C) low pass filter (filter stage 112), which does impart significant (and difficult to control) phase shift over the closed loop bandwidth. In comparison, the third type of closed loop gain control provides a negative feedback signal from after filter stage 112, i.e., from point B. That is, a signal is fed-back from point B to an error amplifier (not shown in either of FIG. 1 or 4) that compares the feedback signal to the input signal 102. The output of the error amplifier is then input to PWM comparator 104. As mentioned above, the output signal is substantially more difficult to control as a negative feedback signal because of the significant phase shift caused by the inductor/capacitor low pass filter combination. However, the post-filter negative feedback closed loop gain control configuration provides a more linear output signal. This is more difficult to implement because the gain must be controlled in terms of the different phase shifts that occur through use of the inductor and capacitor in the output low pass filter. However, greater linearity can be achieved in this configuration, but stability is an issue because of the phase shifts.

Regardless of the type of gain control that is employed, the peak-to-peak ramp voltage has an effect on the open loop gain. By increasing the ramp voltage, the noise immunity of the Class D amplifier can be improved according to an embodiment. As discussed previously, the open loop gain of the modulator block of the amplifier is the ratio of the power supply DC rail voltage to the peak-to-peak ramp voltage. So, increasing the peak-to-peak ramp voltage lowers the gain of the modulator, and also its noise sensitivity. As those of skill in the art can appreciate, presuming a fixed frequency of low noise triangle waveform signal 322, the peak-to-peak voltage of low noise triangle waveform signal 322 is determined by a combination of the value of triangle capacitor 312, and the current source/sink levels (first current source 314, first current sink 320). Further, the power rail voltages, $V_{cc}$ and $V_{ee}$ limit the maximum amount of the output voltage. It further can be appreciated by those of skill in the art that the high logic level of digital clock waveform 303 must be greater than the positive peak value of low noise triangle waveform signal 322, and the low logic level of digital clock waveform 303 must be more negative than the negative peak value of low noise triangle waveform signal 322.

The ramp generator circuitry disclosed in FIG. 3 allows great flexibility in setting peak-to-peak ramp voltage. This can be done on a channel-by-channel basis, if desired, in a multi-channel amplifier. This could prove advantageous in a multichannel amplifier where different channels are designed for different, specific purposes. For example, in a surround-sound amplifier, one channel may be dedicated as a subwoofer driver, with different gain and frequency response requirements. In another application, a multichannel Class-D amplifier might be used inside a powered loudspeaker, where separate amplifier channels are used to drive the different loudspeaker drivers within the speaker cabinet. For example, one channel might drive the woofer, a second channel the midrange driver, and a third channel, the tweeter or super-tweeter. These different driver types have very different frequency response, impedance, power handling and sensitivity requirements. These different drivers could substantially benefit by being driven by an amplifier channel whose gain, frequency response, phase shift and noise sensitivity have been optimized for the specific driver. This is possible using the techniques disclosed according to the aspects of the embodiments described herein.

Attention is now directed to a different aspect of the embodiments described herein. If low noise triangle waveform signal 322 has an output voltage that ranges from +5V to −5V, then the gain of the modulator block of this amplifier is equal to the ratio of the power supply DC rail voltages to the peak-to-peak ramp voltage ($10V_{PP}$). As those of skill in the art can appreciate, this ratio describes the gain of modulator block 109 only. Modulator block 109 is just one of the gain blocks used to determine the open-loop gain of a Class D amplifier. The other blocks that are involved are: the output LC filter (which has unity gain up to its cutoff frequency (which is typically about 50 KHz); shown as filter stage 112 in FIG. 1); the output voltage divider (typically configured as a resistive divider from the output voltage node (point B, or amplified output signal 114 in FIG. 1) to the error amplifier input; not shown in FIG. 1); and the error amplifier itself (also not shown in FIG. 1) which is another circuit block. The error amplifier compares the divided down output voltage to the input voltage. It is configured as an integrator, so that it has very high gain at low frequencies, with decreasing gain as frequency increases. As those of skill in the art can therefore appreciate, it is possible for the Class D amplifier (with all these circuit blocks connected in series), to have an open-loop gain of about 10,000 at 20 Hz, and an open loop gain of about 10 (20 dB) at 20 KHz.

When this $10V_{pp}$ signal is input to a switching amplifier, for example, switching output stage 108 (which is part of modulator block 109), whose output voltage swings between +/−50 volts, then the total open loop gain of modulator block 109 is 10, according to Equation (1):

$$A_{OL} = \frac{V_o}{V_I} = \frac{100\,V_{PP}}{10\,V_{PP}} = 10. \tag{1}$$

Problems can occur, however, when there is a mismatch between the output impedance of the load and the rated power output of the amplifier. For example, if the amplifier is configured to deliver 100 watts at $100V_{PEAK}$ ($200V_{pp}$) with a 49Ω speaker, and the 49Ω speaker is replaced with a 4Ω speaker, then the switching amplifier will be driven into over current situations that will either activate overcurrent protection circuits, or destroy the output transistor(s), as those of skill in the art can appreciate.

There are several conventional methods for dealing with this problem. For example, a switch can be implemented on the panel where the speakers are connected to the Class D amplifier, and the user is required to put the switch in the correct position that corresponds to the load of the connected speaker. The switch then connects an appropriate output voltage from a multi-tapped transformer or multi-output DC power supply to the switching amplifier, i.e., the DC voltage "rails." While many users will correctly move the switch as appropriate, this solution requires the implementation of the multi-tapped transformer or multi-output DC power supply, and all the additional wiring that that entails.

According to further aspects of the embodiments, limiting the duty cycle of the signal output from the modulation stage will limit the average power output to the speakers, and thus can avoid or substantially avoid over-current situations with the output transistor(s). According to aspects of the embodiments, by limiting the duty cycle of the signal output from the modulation stage, the need for changing the DC voltage rails can be avoided. According to further aspects of the embodiments, a switch can also be used to convey to the appropriate circuitry what the correct (or maximum) duty cycle is that can be used with the speakers that have been connected to the Class D amplifier. According to further aspects of the embodiments, a remote sensing mechanism can also be implemented that precludes the use of the switch to correctly set the appropriate duty cycle limit. According to an embodiment, a field programmable gate array (FPGA) can be used, among other devices (e.g., a digital signal processor (DSP)), to limit the output duty cycle. Since the switching frequency is fixed and developed by the internal dividers in the FPGA, it is simple for the FPGA to limit the duty cycle to be a fraction of the switching period. This can be accomplished by counting cycles of a higher frequency clock that the switching frequency is derived from. Use of the FPGA and DSP for limiting the duty cycle of low noise comparator stage output 407 are discussed in greater detail below The following example calculations illustrate how the duty cycle can affect the maximum average output power to speaker 116. In this example, the Class D amplifier has DC voltage rails of +/−100 volts, or $200V_{PP}$. While the duty cycle can range between 0 and 100%, on average it will be about 50%, or duty cycle (D) equals 0.5. The RMS value of a sine waveform is related to the peak voltage according to the following:

$$V_{RMS} = \frac{V_{Peak}}{\sqrt{2}}, \tag{2}$$

or, $$V_{RMS} = \frac{100}{\sqrt{2}} \approx 70\,V_{RMS}.$$

In one typical application a 49Ω speaker is used, and the Class D amplifier is specified to provide about 100 watts (RMS). Then, $$P = VI \text{ (all RMS)}, \text{ or} \tag{3}$$

$$100\,W_{RMS} = 70\,V_{RMS} \times I_{RMS} \text{ or,}$$

$$I_{RMS} = 1.42\,A_{RMS}.$$

If, however, a 4Ω speaker is hooked up by mistake to the Class D amplifier that is capable of delivering 100 Watts, then the output current can spike to about $25A_{PP}$.

$$I_{Peak} = \frac{V_{Peak}}{r} \tag{4}$$

$$I_{Peak} = \frac{100\,V_{Peak}}{4} = 25\,A_{Peak}.$$

This yields an RMS value of—

$$I_{RMS} = 25\,A_{Peak} \times \sqrt{0.5} = 17.6\,A_{RMS}.$$

Thus, switching a 4Ω speaker for a 49Ω speaker can lead to a significant over-current situation (from $1.42A_{RMS}$ to $17.6A_{RMS}$). A current of this magnitude will typically far exceed the current ratings of the output driver transistors of a 100 W amplifier, and thus will, over time, damage them, or at least trigger overcurrent protection, leading to significantly degraded audio performance.

Considering, therefore, that the output voltage is $100V_{Peak}$, and the load is only 4 ohms, the peak current is 25 A (with an RMS value of $17.6A_{RMS}$, the output power (RMS) would be—

$$P_{RMS} = i^2 \times r = 17.6^2 \times 4 \approx 1225 \text{ watts}_{rms}. \tag{5}$$

According to an aspect of the embodiments, the goal is to limit the power through the 4Ω speaker to about 100 watts (or whatever is the maximum output power of the Class D amplifier) by limiting the duty cycle D of the modulation stage to an appropriate value. The RMS value of the output voltage is determined as follows:

$$P_{RMS} = 100\,W_{RMS} = \frac{V_{RMS}^2}{r}, \tag{6}$$

Knowing the desired RMS value of the output voltage from the modulation stage to produce a maximum allowed power, Equation (2) can then be used to determine the peak value of the output voltage, according to the following:

$$V_{Peak} = V_{RMS} \times \sqrt{2},$$

which yields, $$V_{Peak} = 20\,V_{RMS} \times 1.414 = 28.28\ V_{Peak} = 56.56\,V_{PP}. \tag{7}$$

Figure 5:
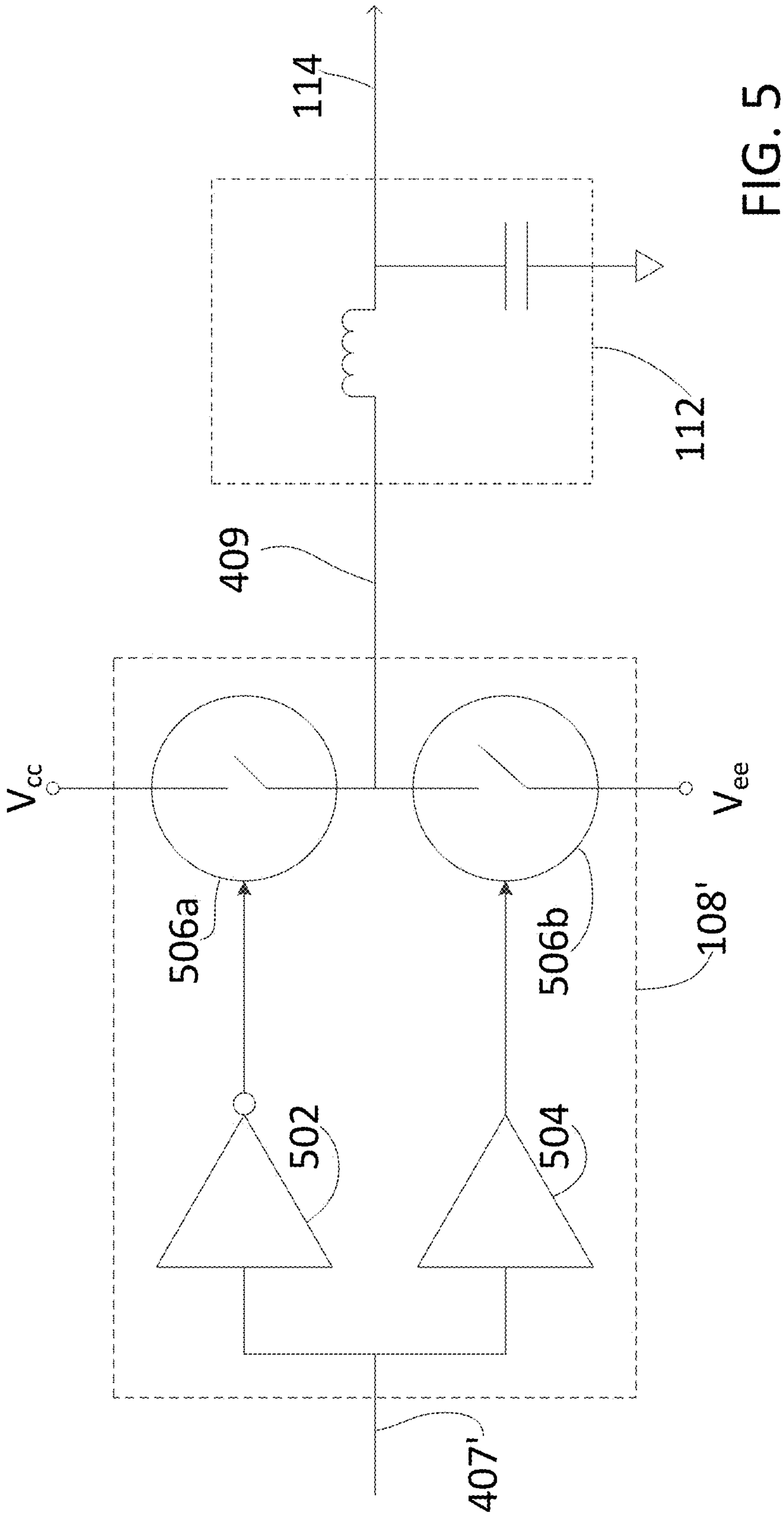
FIG. 5 is a schematic block diagram of switching output stage and output filter using a half-bridge transistor switching apparatus according to an embodiment.

Knowing the peak voltage required from the output of switching output stage 108, the appropriate duty cycle can be determined according to the specific type of transistor switching circuit being used therein. According to an embodiment, and referring to FIG. 5, a half-bridge transistor switching output stage 108' is shown, operation of which is known to those of skill in the art. Half-bridge transistor switching output stage 108' includes receiver inverter 502, receiver non-inverter 504, and first and second switching transistors 506*a,b* (shown in simplified block diagram form of simple switches), which are driven by the outputs of receiver inverter 502 and receiver non-inverter 504 as shown. Through operation of the two receivers 502, 504, and switches 506*a,b*, a pulsed output, low noise switching output 409, is provided to filter stage 112, and then speaker(s) 116. The period of low noise switching output 409 is the same as low noise triangle waveform signal 322 if generated by triangle waveform generator circuit 300 according to an embodiment, and the duty cycle D is the ratio of on-time, t, to the total period T (which is equal to the reciprocal of the frequency of low noise triangle waveform signal 322). Operation of half-bridge transistor switching output stage 108' is known to those of skill in the art. That is—

$$D = \frac{t}{T}. \tag{8}$$

The voltage output of filter stage 112 can be described according to the following expression:

$$V_{Out-Peak} = (t)(V_{cc}) + (1 - t)(V_{ee}). \tag{9}$$

Using the values of $V_{cc}$ equal to +100V and $V_{ee}$ equal to −100V, and using the desired $V_{RMS}$ voltage of 20V (based on the peak output voltage $V_{Peak}$ equal to 28.28V; see, Expression (7) above), then Expression (9) becomes—

$$28.28\,V_{Out-Peak} = (t)(100) + (1 - t)(-100),$$

and from this the duty cycle t can be determined as—

$t$=64.14%.

Therefore, with a 100 watt maximum output Class D amplifier ostensibly designed to provide 100 watts into a 49Ω speaker load, by limiting the duty cycle D of the modulation stage to about 64%, the RMS value of the voltage will be limited to about $20V_{RMS}$, and the power through the 4Ω speaker will be limited to about 100 W. As those of skill in the art can now appreciate, for different values of speaker load and/or output power of the Class D amplifier, the duty cycle would change accordingly.

Figure 4:
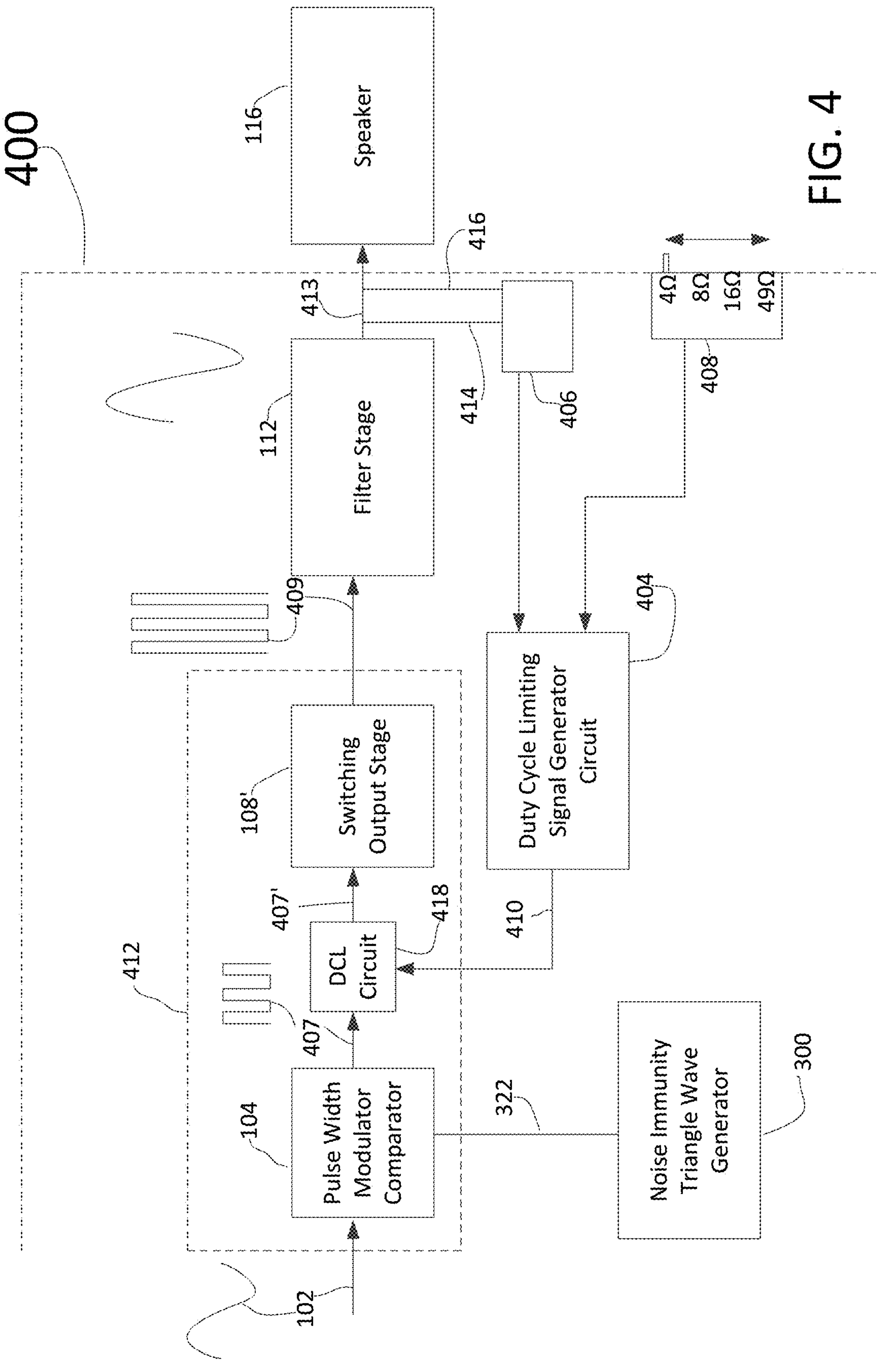
FIG. 4 is a block diagram of an advanced Class D amplifier according to aspects of the embodiments.

FIG. 4 illustrates a schematic block diagram of advanced Class D amplifier (advanced amplifier) 400 according to an embodiment. Advanced amplifier 400 implements the different aspects of the embodiments for noise suppression and immunity and duty cycle limitation as described above, and below in regard to method 700 described in regard to FIG. 7. According to embodiments, advanced amplifier 400 includes PWM comparator 104, duty cycle limiting (DCL) circuit 418, switching output stage 108 (components 104, 108, and 418 comprises duty cycle limiting modulation block 412), filter stage 112, noise immune triangle waveform generator 300, speaker impedance sensing circuit 406 (or manual speaker impedance selection switch 408), and duty cycle limiting-signal generator circuit 404. In fulfillment of the dual purposes of clarity and brevity, switching output stage 108 and filter stage 112 need not be discussed again as their design and use within advanced amplifier 400 according to an embodiment has not changed from the discussion made previously in regard to FIGS. 1 and 5, discussed above.

The output of duty cycle limiting-signal generator circuit 404 is duty cycle limiting signal 410. Duty cycle limiting signal 410 is used by DCL 418 to limit the duty cycle of low noise comparator stage output signal 407 according to an embodiment. Generation of duty cycle limiting signal 410 is based on inputs received from speaker impedance sensing circuit 406, or manual speaker impedance selection switch 408 according to an embodiment. Speaker impedance sensing circuit 406 receives current sense/measurement signal 414 and voltage sense/measurement 416 as inputs. Duty cycle limiting signal generator circuit 404 can be comprised of hardware alone, an implementation of software within a processor alone, or a combination thereof according to further embodiments. Such implementations of circuit functionality are known to those of skill in the art.

Speaker impedance sensing circuit (impedance sensing circuit) 406 operates in the following manner. According to embodiments, impedance sensing circuit 406 simultaneously senses or measures output voltage and output current. The output voltage can be measured using known voltage measurement techniques and devices, and the output current can similarly be measured or sensed using known current measurement or sensing techniques and devices (which can include Hall effect current sensing devices, current transformer sensing/measurement devices, and/or precision low value resistors). As can be appreciated by those of skill in the art, with these two inputs alone, processing circuits (including analog-to-digital converters) in impedance sensing circuit 406 can determine (i.e., calculate) the impedance of the attached speaker load, speaker(s) 116. Manual speaker impedance selection switch can be a multi-pole switch, or multi-position selection switch that outputs a digital signal that represents the user's selection of speaker impedance, or a DC voltage signal of varying amplitude based on the user's selection of the speaker impedance.

According to an aspect of the embodiments, duty cycle limiting signal generator circuit 404 can accept either type of speaker impedance determination signals and use either to create duty cycle limiting signal 410, along with one or more indication signals of the maximum output power of advanced amplifier 400 and the speaker impedance selected, in accordance with the discussion above.

Once duty cycle limiting signal generator circuit 404 has generated duty cycle limiting signal 410, which can generally be in the form of a digital signal, DCL circuit 418 accepts it as an input and uses it to limit the output duty cycle of low noise comparator stage output signal 407 according to an embodiment. According to a further embodiment, DCL circuit 418 can be in the form of an FPGA, or digital signal processing (DSP) circuit. If DCL 418 is in the form of an FPGA, the FPGA can limit the duty cycle based on generated duty cycle limiting signal 410. If the duty cycle of low noise comparator stage output signal 407 did not need to be restricted (because the load impedance of speakers 116 matched the output power of advanced class D amplifier 400), then no restriction on the duty cycle would be enforced by DCL circuit 418. That is, low noise comparator stage output signal 407 from PWM comparator 104 would propagate through the FPGA (DCL 418) as transparent logic, with its "normal" 0% to 100% duty cycle range. In this case, the output of DCL 418 would be low noise comparator stage output signal 407. If, however, a particular duty cycle limit is activated, then the FPGA, using known programming techniques, can prematurely end or terminate any pulse from PWM comparator 104 that exceeds the selected duty cycle limit. In this case, the output of DCL 418 would be duty cycle limited (DCL) low noise comparator stage output signal 407'. A substantially similar mechanism can occur if instead of an FPGA a digital signal processor (DSP) were used for DCL circuit 418. Use of, and programming thereof, of DSPs is known to those of skill in the art.

Figure 6:
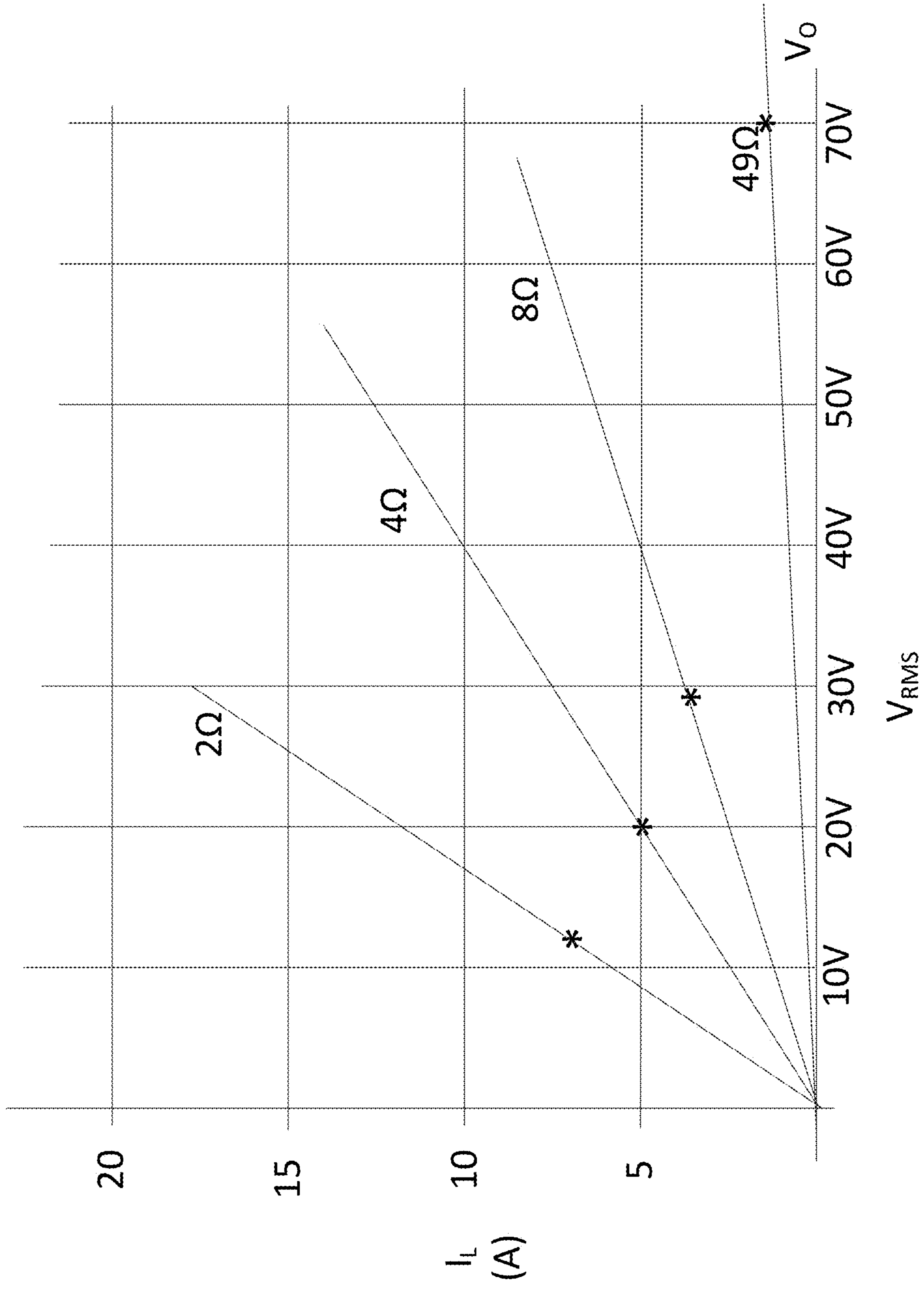
FIG. 6 is a chart of output current versus output voltage for a Class D amplifier according to an embodiment.

According to embodiments, the DSP acting as DCL circuit 418 could accept as an input the digital signal output from duty cycle limiting signal generator circuit 404, duty cycle limiting signal 410, and using one or more pre-stored graphs as shown in FIG. 6, determine the impedance of speaker(s) 116. For example, if the current and voltage measured by impedance sensing circuit 406 equal to 6.25 A and 50 $V_{RMS}$, which is then provided in digital form to DCL circuit 418, DCL circuit 418 could then refer to the graph of FIG. 6, and determine that an 8Ω speaker (50V/6.25 A=8Ω) is connected, and limit the duty cycle of low noise comparator stage output signal 407 accordingly, based on the other parameters, as discussed above. It should be noted, however, that FIG. 6 has been created for a Class D amplifier.

FIG. 6 illustrates several data points, one for each of a 2Ω load line, 4Ω load line, 8Ω load line, and a 70V load line (presuming the load impedance is 49Ω. As known to those of skill in the art, 70VRMS is used for long speaker wire runs, such as in large buildings, or auditoriums, wherein the loss of power over extended wire runs is of concern. By boosting the voltage through a transformer, or other means, to step up the signal voltage to about 70VRMS, and then stepping it down at the speaker, less current needs to be sent through the connecting wires, which could be several hundred if not thousands of feet in length. These speaker configurations are known to those of skill in the art.

As those of skill in the art can appreciate, impedance sensing circuit 406, duty cycle limiting signal generator circuit 404 and DCL circuit 418, can all be combined into one circuit package, or two circuits, or even more than the three as shown in FIG. 4, and still be considered within the scope of the aspects of the embodiments. For example, it is known to those of skill in the art that DSPs and other circuits (such as FPGAs) can include analog-to-digital converters and other circuitry, including logic and memory (which can include many different types, including, but not limited to programmable read only memory, random access memory, flash drive memory, hard drives, floppy drives, among others), which can be used to store the information that correlates or determines impedance of speaker(s) 116 to a desired duty cycle (especially as that based on the information shown in the graph of FIG. 6, or other such substantially similar graphs). Furthermore, it should be apparent to those of skill in the art that an actual "graph" need not be stored in either or both FPGA or the DSP acting as DCL 418, but instead the corresponding data would be stored in the form of a table, or database, wherein the current and voltage values determined by impedance sensing circuit 406 act as inputs to determine the correct load impedance which can then be used to determine the correct duty cycle as described above in the one or more equations/expressions.

According to an embodiment, as discussed above in regard to FIG. 3, low noise triangle waveform signal 322 is generated according to operation of the devices shown therein, and this includes digital clock signal 303 as generated by digital clock circuit 302, DC servo circuit 304, first and second diodes 316, 318, triangle capacitor 312, first current source 314, and first current sink 320. Together, these devices comprise noise immune triangle waveform generator circuit 300 according to an embodiment. The signal output from triangle waveform generator circuit 300, low noise triangle waveform signal 322, is input to PWM comparator 104 according to an embodiment. As such, low noise triangle waveform signal 322 operates substantially similarly to other triangle waveform signals, but because of the aspects of the embodiments described above, can be substantially noise free, or immune from noise generated by different aspects of operating a triangle waveform generator.

Figure 7:
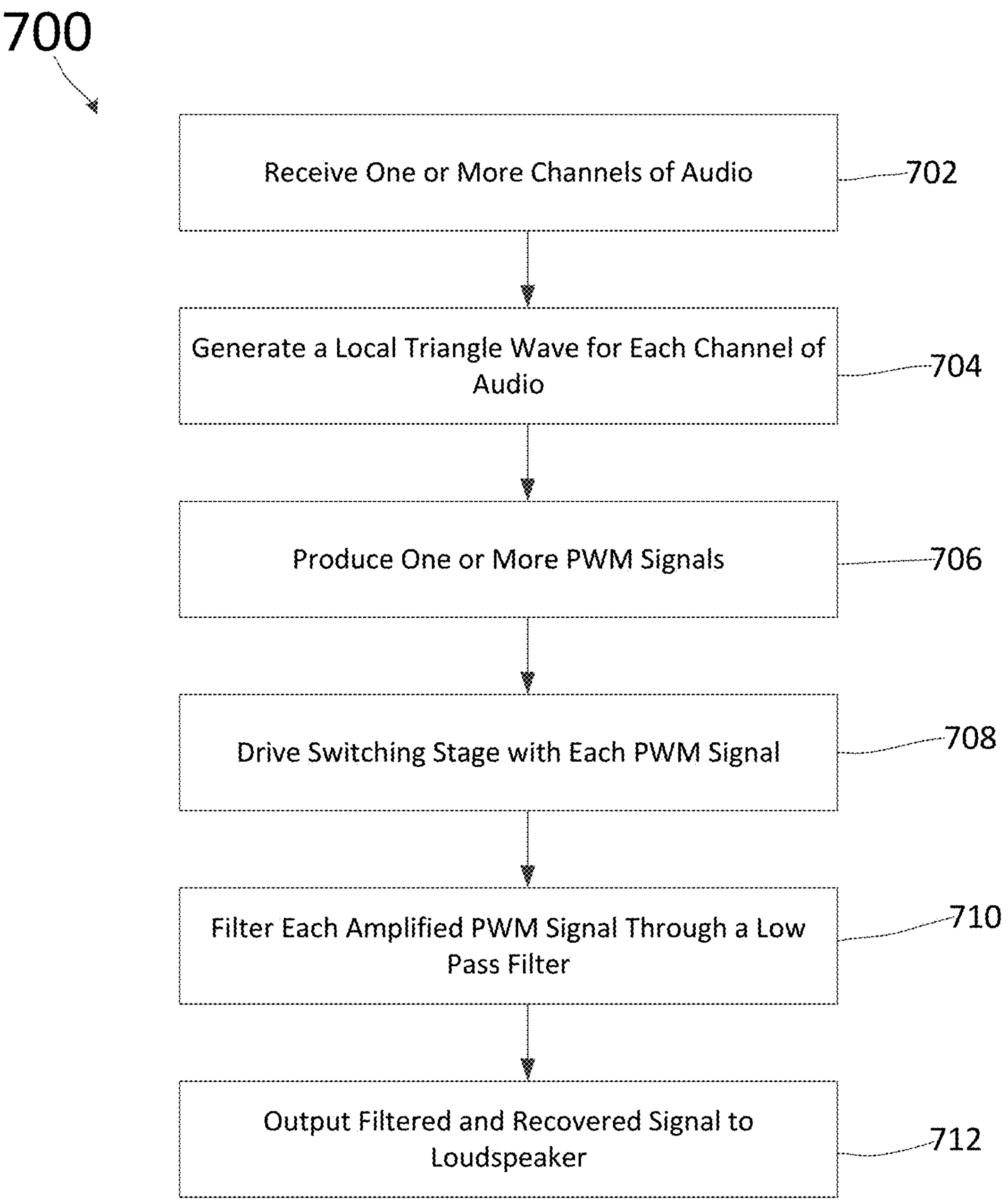
FIG. 7 is a flowchart illustrating steps to perform a method for operating a multi-channel Class D audio amplifier according to aspects of the embodiments, wherein crosstalk noise is substantially reduced or eliminated, and mismatching speaker loads with respect to output power is substantially prevented.

FIG. 7 is a flowchart illustrating steps to perform method 700 for operating advanced multi-channel Class D audio amplifier 400 according to aspects of the embodiments, wherein crosstalk noise is substantially reduced or eliminated, and mismatching speaker loads with respect to output power is substantially prevented.

In step 702, advanced amplifier 400 receives one or more channels of audio. In step 704, for each channel of audio, a local triangle wave is generated, low noise triangle waveform signal 322. A global digital clock signal generator, digital clock circuit 302, can output a fixed frequency clock signal, digital clock signal 303, which can provide a synchronized signal to each local triangle waveform generator 350. According to aspects of the embodiments, digital clock signal 303 can be about a 384 kHz clock signal. According to an aspect of the embodiments, each channel of audio receives low noise triangle waveform signal 322 that is generated by noise-free triangle waveform generator circuit 300 that comprises one or more diodes 316, 318 to isolate the digital clock. According to an aspect of the embodiments, each channel of audio receives low noise triangle waveform signal 322 that is generated by noise-free triangle waveform generator circuit 300 that comprises DC servo circuit 340 that substantially maintains a symmetrical low noise triangle waveform signal 322 with substantially zero DC offset. According to a further aspect of the embodiments, each channel of audio receives low noise triangle waveform signal 322 that is generated by noise-free triangle waveform generator circuit 300 that further comprises a means for increasing a peak-to-peak amplitude of low noise triangle waveform signal 322. Each of these aforementioned aspects of the embodiments provides additional noise immunity for each of the channels of audio.

Following step 704, in step 706, method 700 generates one or more PWM signals from a comparison of a channel of audio with low noise triangle waveform signal 322 using PWM comparator 104. As those of skill in the art can appreciate, the duty cycle of the signal output from PWM comparator 104, low noise comparator stage output 407/407', need not have its duty cycle limited in any manner. However, according to aspects of the embodiments, the duty cycle of the signal is directly proportional with the amplitude of the audio signal but can be constrained according to the duty cycle limiting discussions provided above.

Method 700 then proceeds to step 708, wherein the one or more PWM signals drive switching output stage 108 to produce one or more amplified PWM signals, low noise switching output signal 409. Then, in step 710, the one or more amplified PWM signals, low noise switching output signal 409 are filtered through substantially lossless low pass filter stage 112 to remove the high frequency components of low noise switching output signal 409 and recover the audio signal which is now amplified. The amplified, filtered, output signal, low noise amplified output signal 413, is then sent to speaker 116.

Figure 8A:
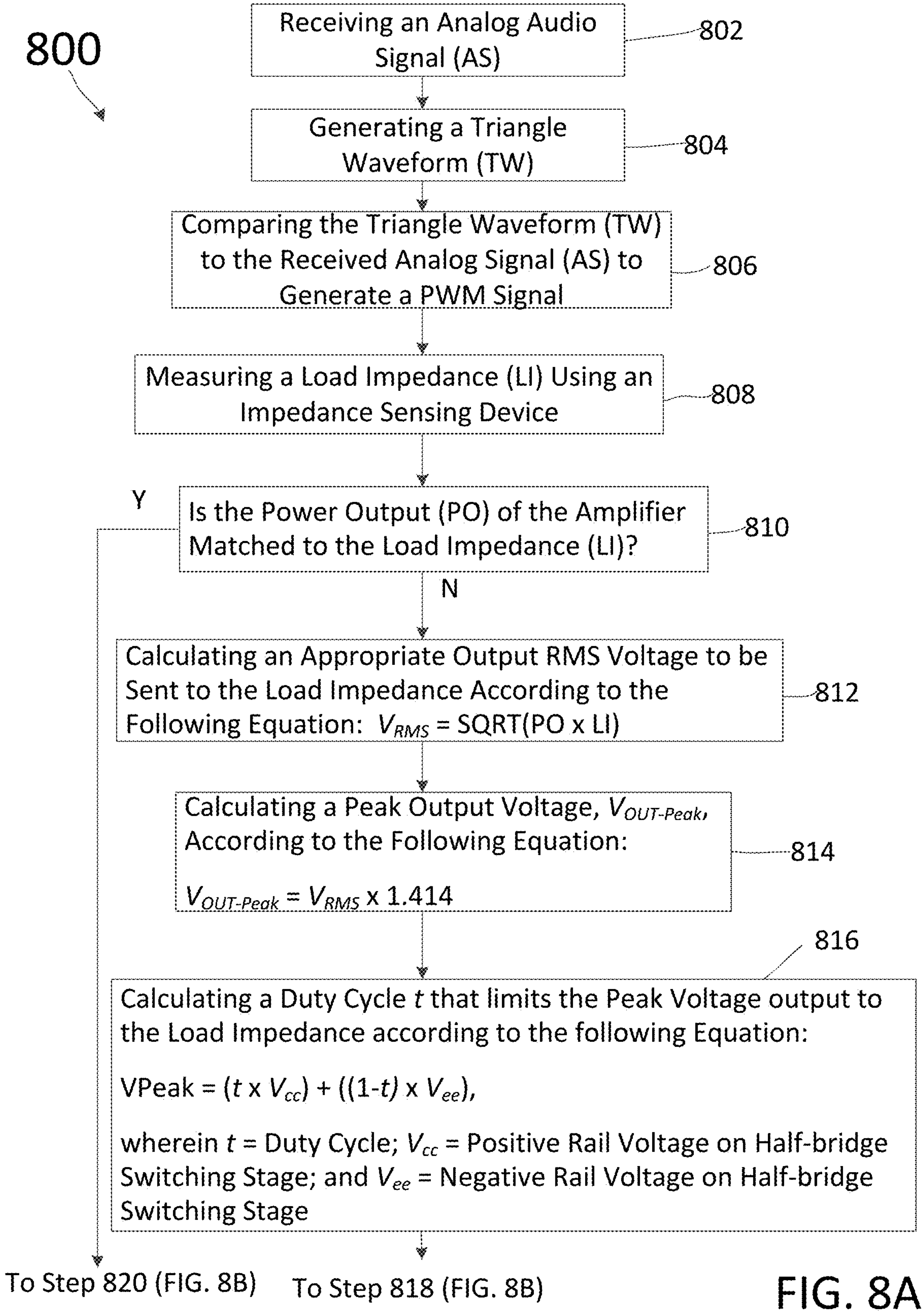
FIGS. 8A and 8B illustrate a flow chart of a method for delivering a duty cycle limited signal to a speaker load in an advanced Class D amplifier using a half-bridge switching output stage according to an embodiment.
Figure 8B:
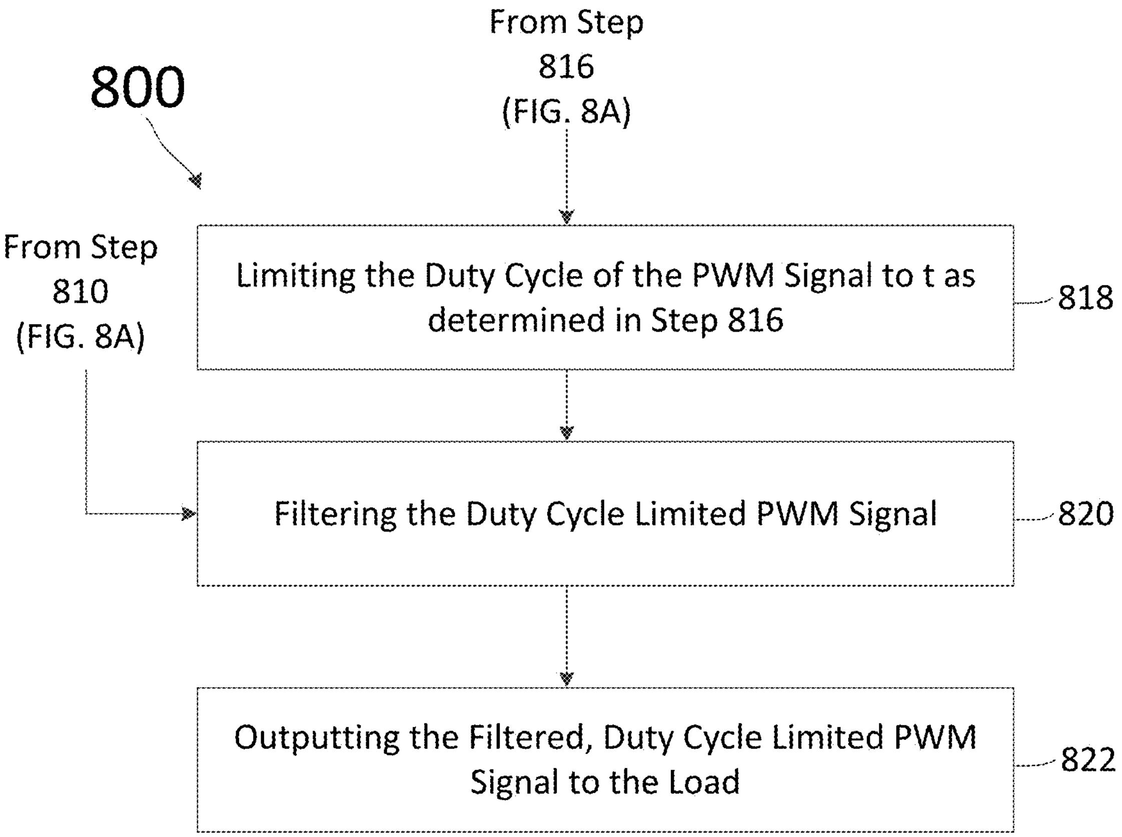

FIG. 8 illustrates a flow chart of method 800 for delivering a duty cycle limited signal to a speaker load in advanced Class D amplifier 400 using a half-bridge switching output stage according to an embodiment.

Method 800 begins with step 802 in which an analog signal is received by advanced Class D amplifier. In step 804, low noise triangle wave signal 322 is generated, as described above in reference to FIG. 3. According to an embodiment, triangle wave 105 can also be used instead of low noise triangle waveform signal 322. In step 806, method 800 compares low noise triangle waveform signal 322 (or triangle wave 105; from herein on, in fulfillment of the dual purposes of clarity and brevity, discussion shall be limited to the low noise embodiment as described in reference to FIG. 3, although, as one of skill in the art can appreciate, aspects of the embodiments directed to limiting the duty cycle of the half-bridge switching output signal can be used with conventionally generated signals as well) to the received analog signal to generate a pulse width modulator comparator output signal, low noise comparator stage output signal 407.

In method step 808, a load impedance of speaker(s) 116 is measured using impedance sensing circuit 406 according to aspects of the embodiments. In method step 810, the output of impedance sensing circuit 406 is used to determine whether the rated power output of advanced Class D amplifier 400 is appropriately matched to the load impedance of speaker(s) 116. That is, method 800 determines whether too much current/power will be generated, or attempted to be generated by advanced Class D amplifier 400 if the load impedance of speakers 116 is mismatched to the rated output power. As described above, the over-power/over-current situation generally occurs when the load impedance of speakers 116 is less than a predetermined value determined in view of the maximum output voltage and maximum current values output from advanced Class D amplifier 400. As described above in reference to FIGS. 4-7, such a situation can lead to damage of the half-bridge switching transistors, or current limiting techniques can occur, either or both of which can happen and cause poor audio quality.

If the measured load impedance of speaker(s) 116 is matched to the rated power output of advanced Class D amplifier 400 (i.e., the load impedance is matched to the present duty cycle selection (which can be no selection, meaning 0% to 100% duty cycle is permissible); "Yes" path from decision step 810), then method 800 proceeds to step 820, wherein the signal is filtered through substantially lossless low pass filter stage 112, and in step 822 the filtered signal is output to speaker(s) 116.

If, however, the load impedance of speaker(s) 116 is not matched to the rated power output of advanced Class D amplifier 400 ("No" path from decision step 810), then method 800 proceeds to method step 812. In step 812, method 800 calculates an appropriate output RMS voltage to be sent to speaker(s) 116 according to the following equation:

$$V_{RMS} = SQRT(PO \times LI).$$

Then, in method step 814, method 800 uses Equation (2) from above to determine peak output voltage:

$$V_{PEAK} = V_{RMS} \times 1.414$$

From the determined peak output voltage (being sent to speaker(s) 116), method 800 can use Equations 8 and 9 from above to calculate duty cycle t that limits the peak voltage output to match the load impedance and rated output power of advanced Class D amplifier 400 according to the following equation:

$$V_{PEAK} = (t \times V_{cc}) + (1 - t), \text{ wherein}$$

$$t = \text{Duty Cycle;}$$

$$V_{cc} = \text{Positive Rail Voltage on Half-bridge Switching Stage; and}$$

$$V_{ee} = \text{Negative Rail Voltage on Half-bridge Switching Stage.}$$

In method step 818 method 800 uses the calculated duty cycle t to limit the duty cycle of low noise comparator stage output signal 407 to create DCL low noise comparator stage output signal 407', as described above in reference to FIGS. 4-7, and especially in regard to circuit elements 404, 406, and 418. Then, in method step 820, method 800 filters DCL low noise comparator stage output signal 407', and the filtered, duty cycle limited signal is output to speaker(s) 116 in method step 822.

Figure 9:
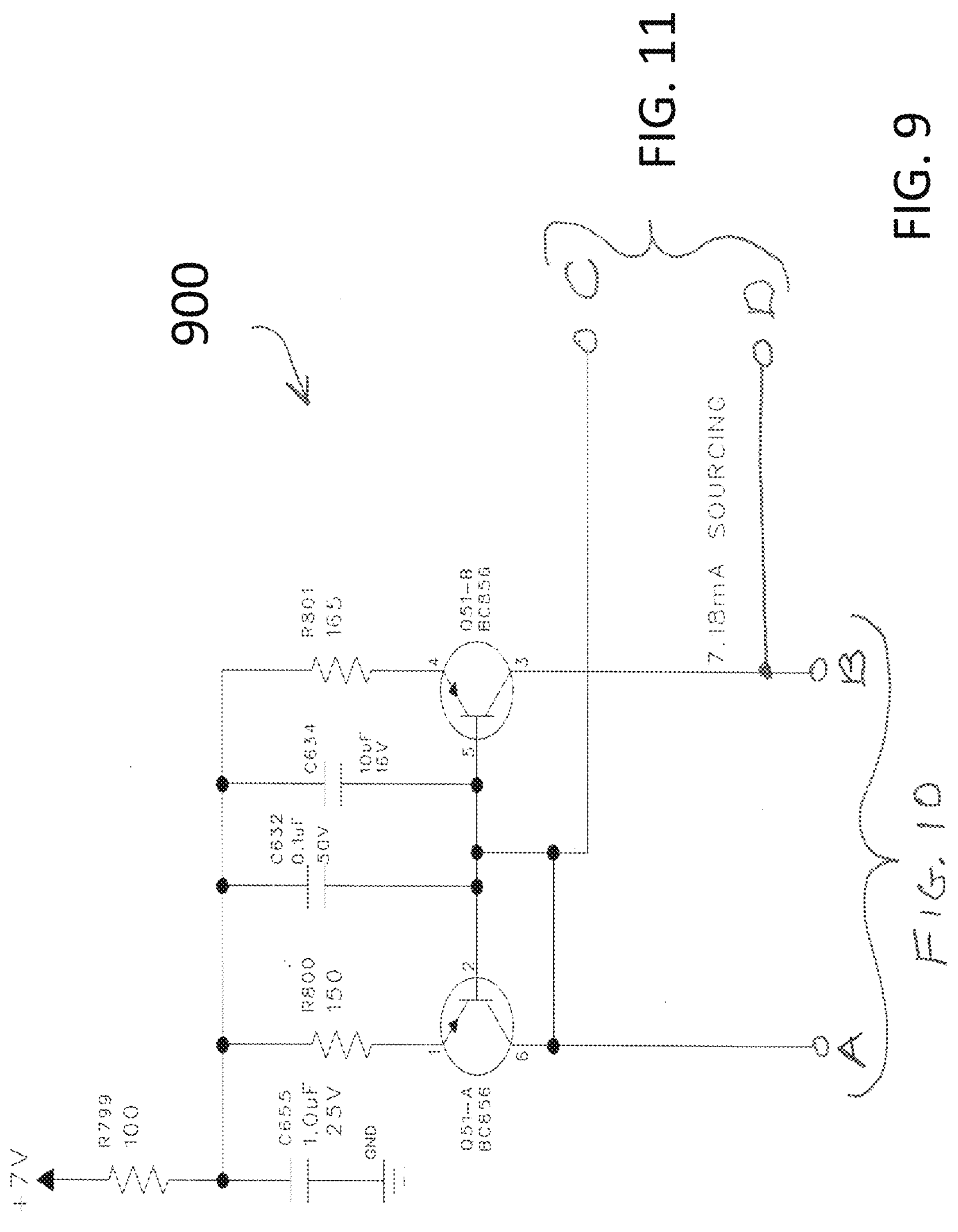
FIG. 9 illustrates a first current source circuit used in a triangle wave generator circuit according to further aspects of the embodiments.
Figures 9, 10, 12:
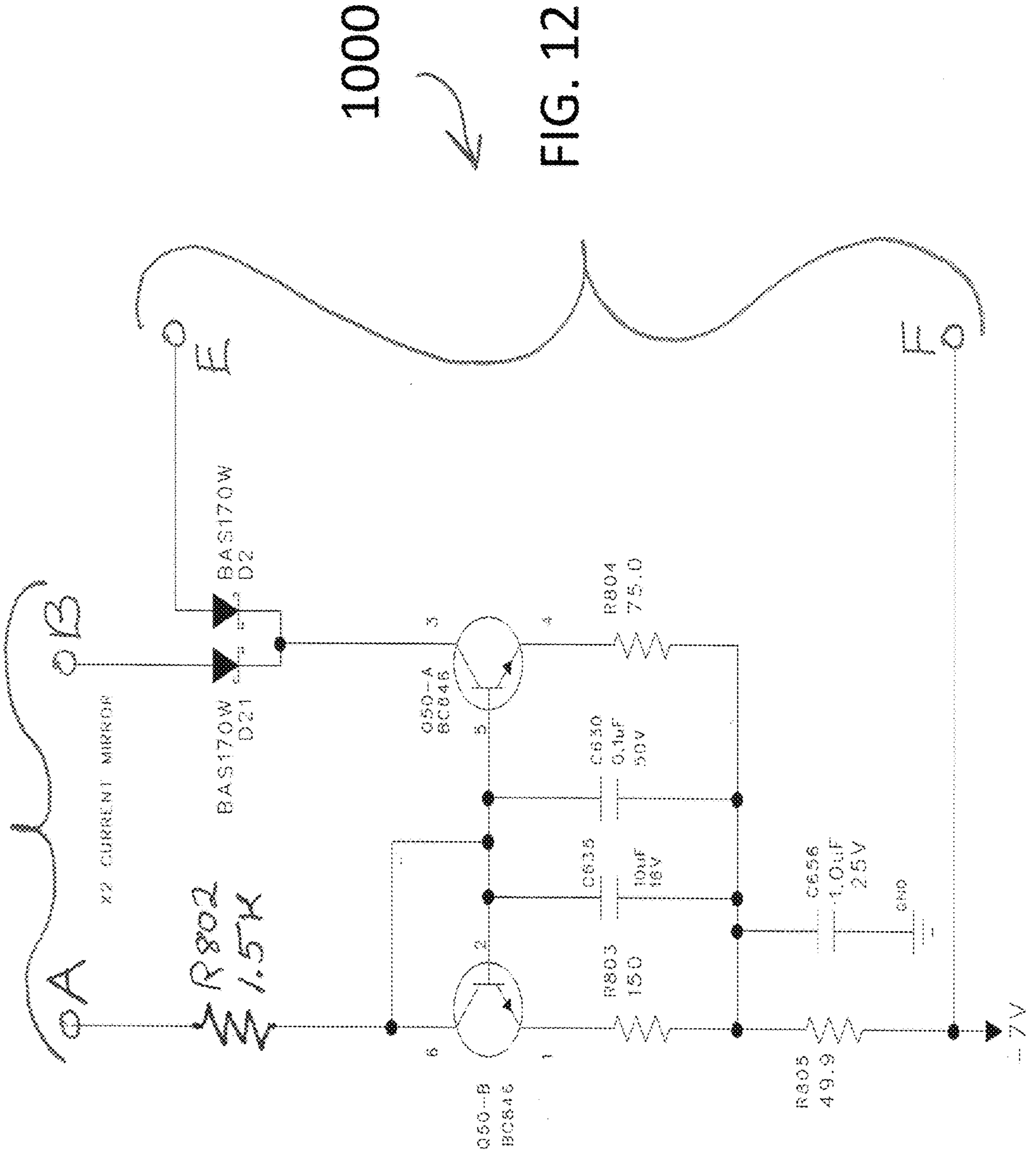
FIG. 10 illustrates a first current sink circuit used in a triangle wave generator circuit according to further aspects of the embodiments.
FIG. 12 illustrates a square wave clock signal generator circuit used in a triangle wave generator circuit according to aspects of the embodiments.
Figure 13:
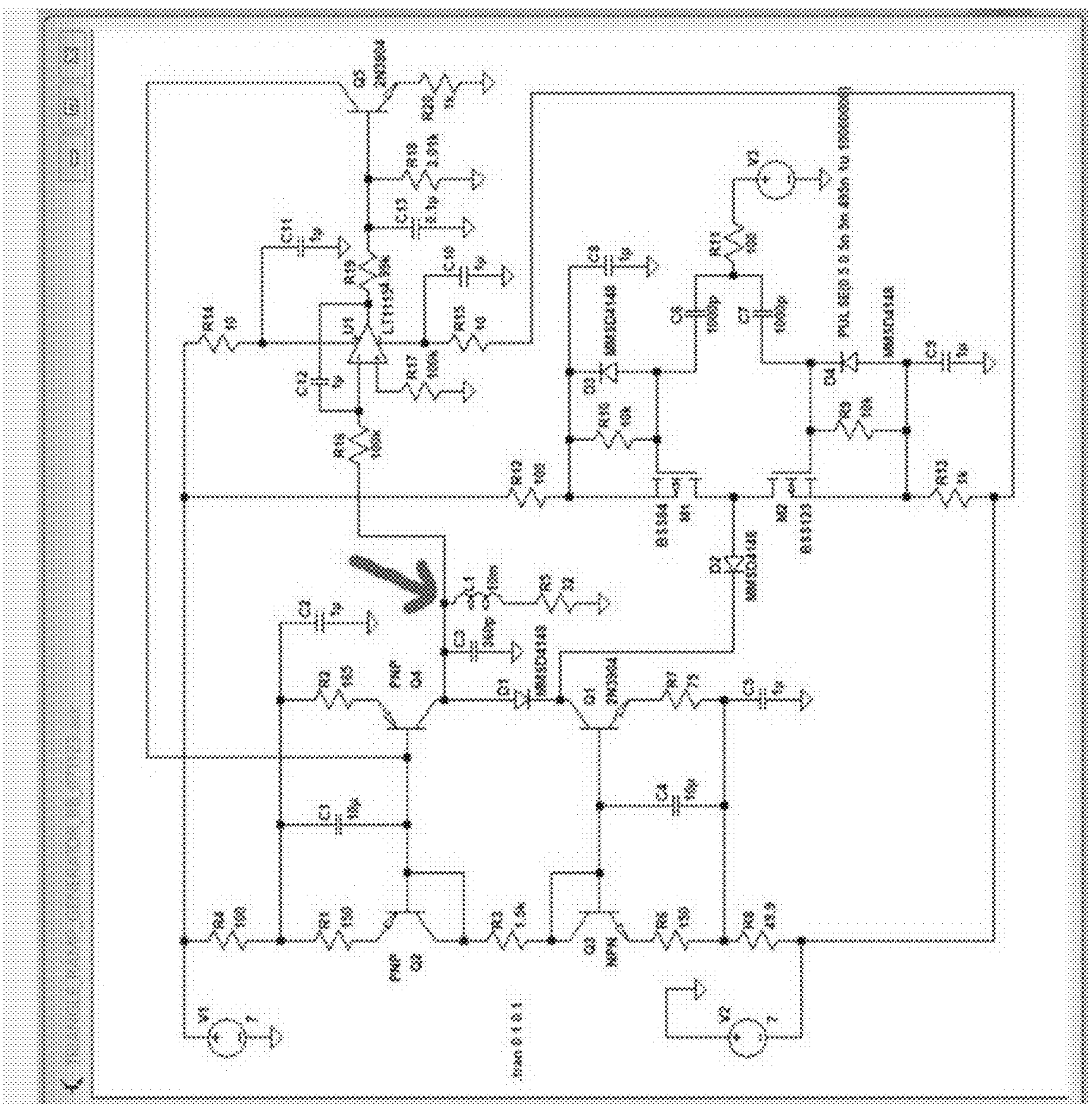
FIG. 13 illustrates a circuit that simulates the circuit of FIGS. 9-12, and therefore
Figure 14:
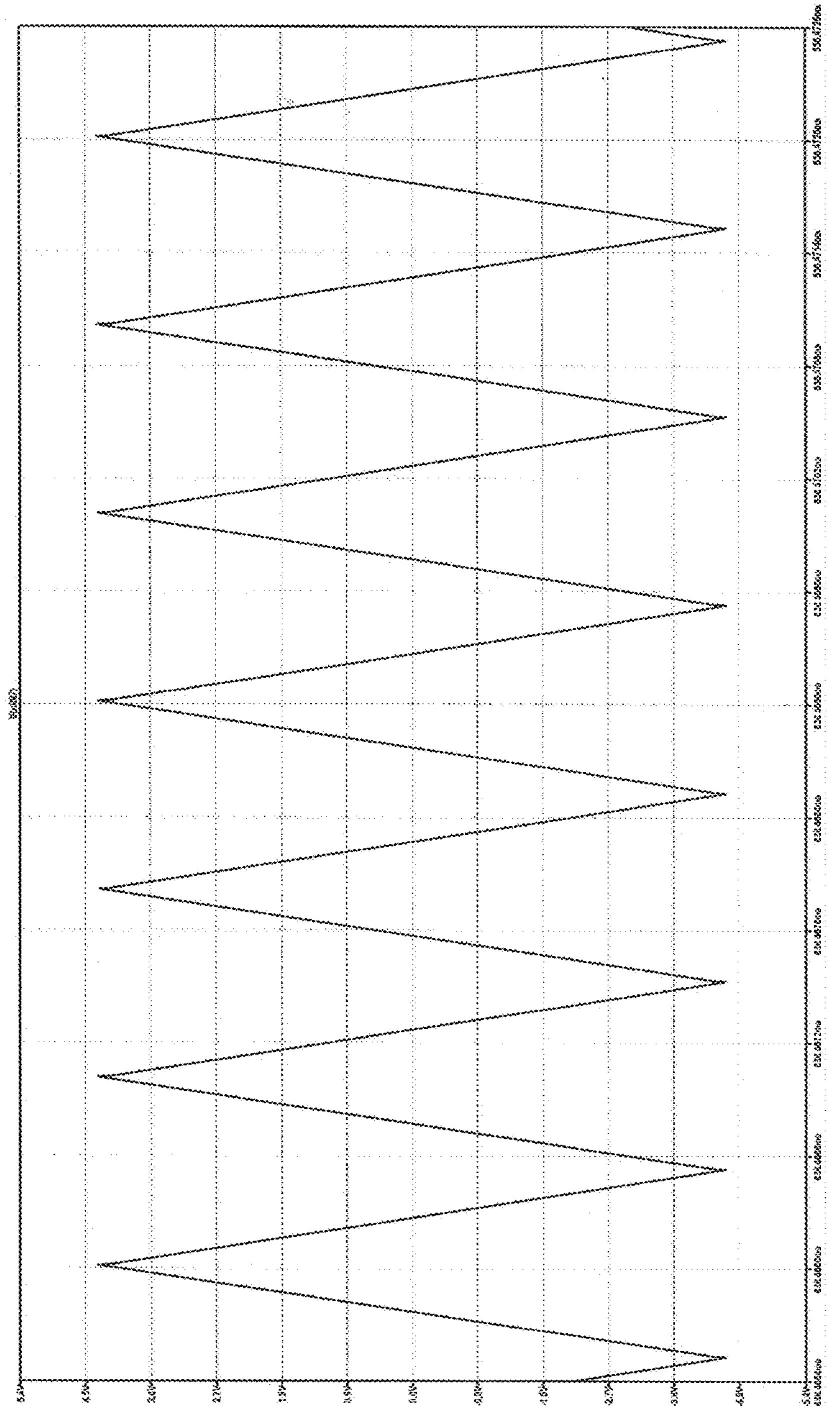
FIG. 14 illustrates a triangle wave voltage output from a simulation of operation of the circuit of FIG. 13, and hence is a simulation of operation of the circuits of FIGS. 9-12 according to aspects of the embodiments.

Attention is directed to FIGS. 9-14, and the circuits illustrated therein. In composite, the circuits of FIGS. 9, 10, 11, and 12 illustrate a triangle waveform generator circuit, which is substantially similar to, but different in some respects, to that of triangle waveform generator circuit 350 as shown in FIG. 3. Therefore, in composite, the circuits of FIGS. 9-12 will be referred to as triangle waveform generator circuit (TWGC) 350'. TWGC 350' generates a triangle ramp output signal with reduced audio noise according to aspects of the embodiments. FIG. 9 illustrates a first current source circuit 900 used in TWGC 350' circuit according to further aspects of the embodiments. First current source circuit 900 is substantially similar to first current source 314 as shown in FIG. 3. FIG. 10 illustrates a first current sink circuit 1000 used in TWGC 350' according to further aspects of the embodiments. First current sink circuit 1000 is substantially similar to first current sink circuit 320 as shown in FIG. 3. FIG. 11 illustrates DC servo circuit 1100 used in TWGC 350' according to further aspects of the embodiments. FIG. 12 illustrates square wave clock signal generator circuit 1200 used in TWGC 350' according to aspects of the embodiments. Square wave clock signal generator circuit 1200 is substantially similar to digital clock circuit 302, and the output of square wave clock signal generator circuit 1200 is substantially similar to digital clock signal 303 as shown in FIG. 3. Note that in each of FIGS. 9-12 there are several nodes labeled A-F. Node A of FIG. 9 corresponds to node A of FIG. 10, node B of FIG. 9 corresponds to node B of FIG. 10, and so on. FIG. 13 illustrates a simulation circuit that simulates the operation of circuits 900, 1000, 1100 and 1200 when operated together (simulation circuit) 1300. Simulation circuit 1300 of FIG. 13 is therefore a substantially similar electrical/electronic equivalent to the combination of circuits of FIGS. 9-12, and thus also substantially similar, but different in some respects, to the circuitry as shown in FIGS. 3 and 4. FIG. 14 illustrates triangle wave voltage output from a simulation of operation of the circuit of FIG. 13, and hence is a simulation of operation of the circuits of FIGS. 9-12 according to aspects of the embodiments.

Referring first to FIG. 12, square wave clock signal generator circuit 1200 receives as an input a square wave generated by a crystal oscillator, which is not shown. The square wave signal switches between about 0 and about +5V at about a 50% duty cycle. The square wave signal output of square wave clock signal generator circuit 1200 synchronizes DC servo circuit 1100 so that it operates—i.e., the frequency of the output—is substantially similarly to the crystal-controlled frequency. Thus, the frequency of triangle ramp output signal 1104 will be substantially the same as the frequency of the square wave generated by the crystal output signal of square wave clock signal generator circuit 1200 (between points E and F). According to aspects of the embodiments, there are numerous advantages to having the frequency of the output of DC servo circuit 1100 tightly controlled.

By way of a non-limiting example having a precise frequency square wave clock signal means that high-Q notch filters can be implemented at that frequency. Furthermore, using a precise frequency means that switching noise in various parts of the circuit can be removed, without effecting circuit functionality at other frequencies.

As those of skill in the art can appreciate, other types of Class-D amplifier designs are based on variable-frequency topologies. Notwithstanding that there are some benefits from variable-frequency designs, they have the disadvantage that notch filters cannot be used, and the varying frequency can possibly make EMI mitigation more difficult, because the EMI could occur at many different frequencies.

Attention is now directed towards FIG. 11, which illustrates DC servo circuit 1100. According to aspects of the embodiments, DC servo circuit 1100 also includes audio noise frequency shunt circuit 1102 according to aspects of the embodiments. The addition of inductor L7 in parallel with DC servo circuit 1100 capacitors C939 and C940 substantially reduces the impedance of DC servo circuit 1100 to noise currents in the audio bandwidth (20 Hz to 20 KHz). As those of skill in the art can now appreciate, a substantial reduction in impedance in the output of DC servo circuit 1100 essentially shunts audio frequency noise currents to ground, because the combination of capacitance and inductance acts as a virtual short-circuit for noise currents only (because of their expected bandwidth), while simultaneously presenting a high impedance to the triangle wave frequency of the triangle signal output of DC servo circuit 1100 (1 MHz), by way of non-limiting example. This selective action is facilitated by the significant difference in frequency ranges in this circuit. Such audio frequency noise can originate as current noise in the transistors, and thermal noise in the resistors, as well as noise in the power supply rails, powering the circuitry.

As those of skill in the art can appreciate, it is desirable to have DC servo circuit 1100 designed to produce a triangle wave signal that operates at a well-defined and fixed frequency. The frequency of the triangle wave signal output from DC servo circuit 1100 is the switching frequency (PWM frequency) of the Class-D amplifier, and is preferably greater than 250 KHz, in order to maximize the bandwidth of the Class-D amplifier. According to aspects of the embodiments, the frequency of triangle ramp output signal 1104 from DC servo circuit 1100 is about 1 MHz. As those of skill in the art can appreciate, the audio signal bandwidth occupies a much lower frequency range of about 20 Hz to about 20 KHz.

By way of non-limiting examples, a few calculations are shown below indicating impedance values of DC servo circuit 1100 capacitors $C_{939}$ and $C_{940}$ and the added shunt inductor $L_7$ over the audio frequency range, and at the much higher fixed switching frequency.

Figure 17:
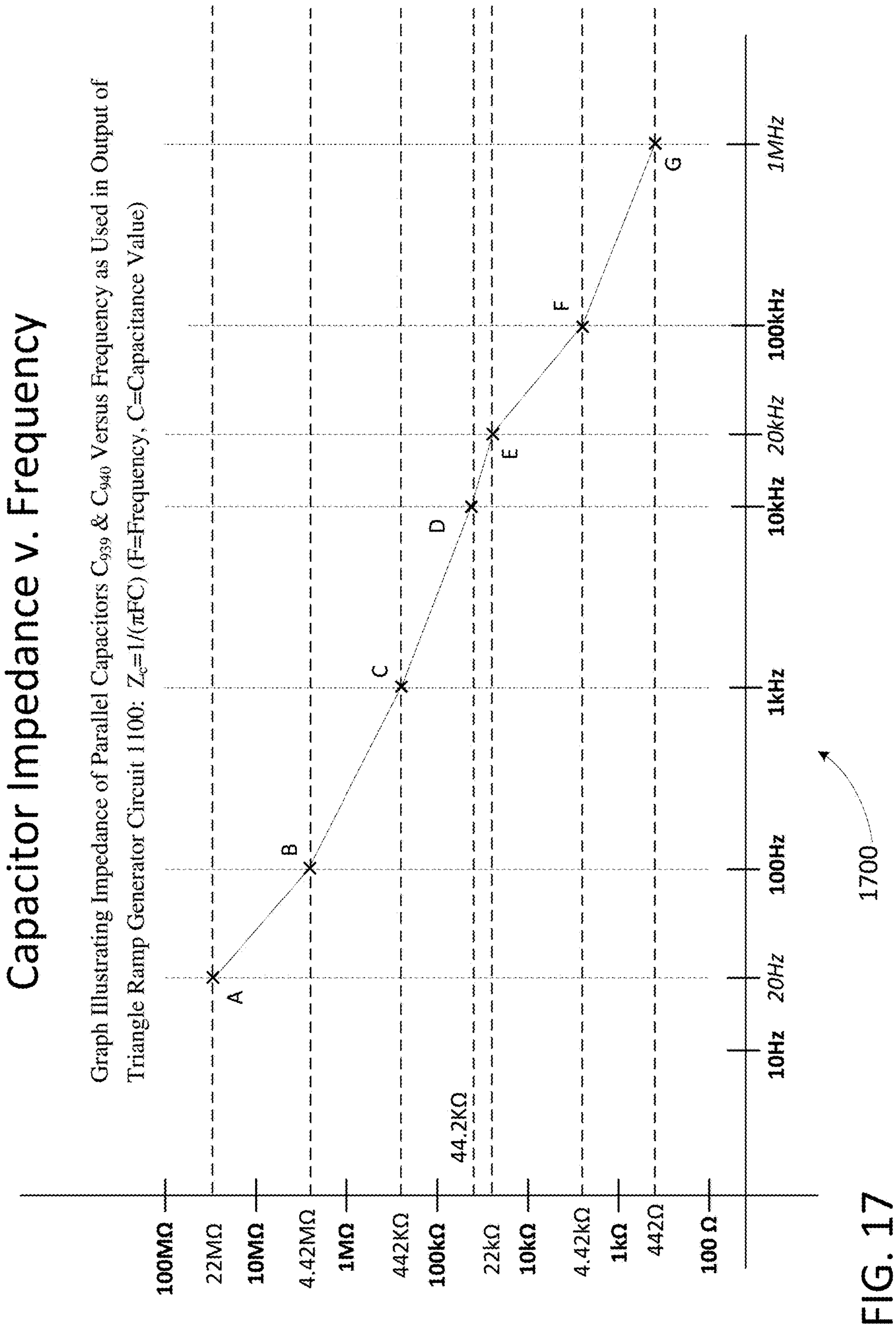
FIG. 17 illustrates a graph of capacitor impedance v. frequency over a fixed frequency range in regard to an output of the triangle ramp generator circuit of FIG. 11 according to aspects of the embodiments.
Figure 18:
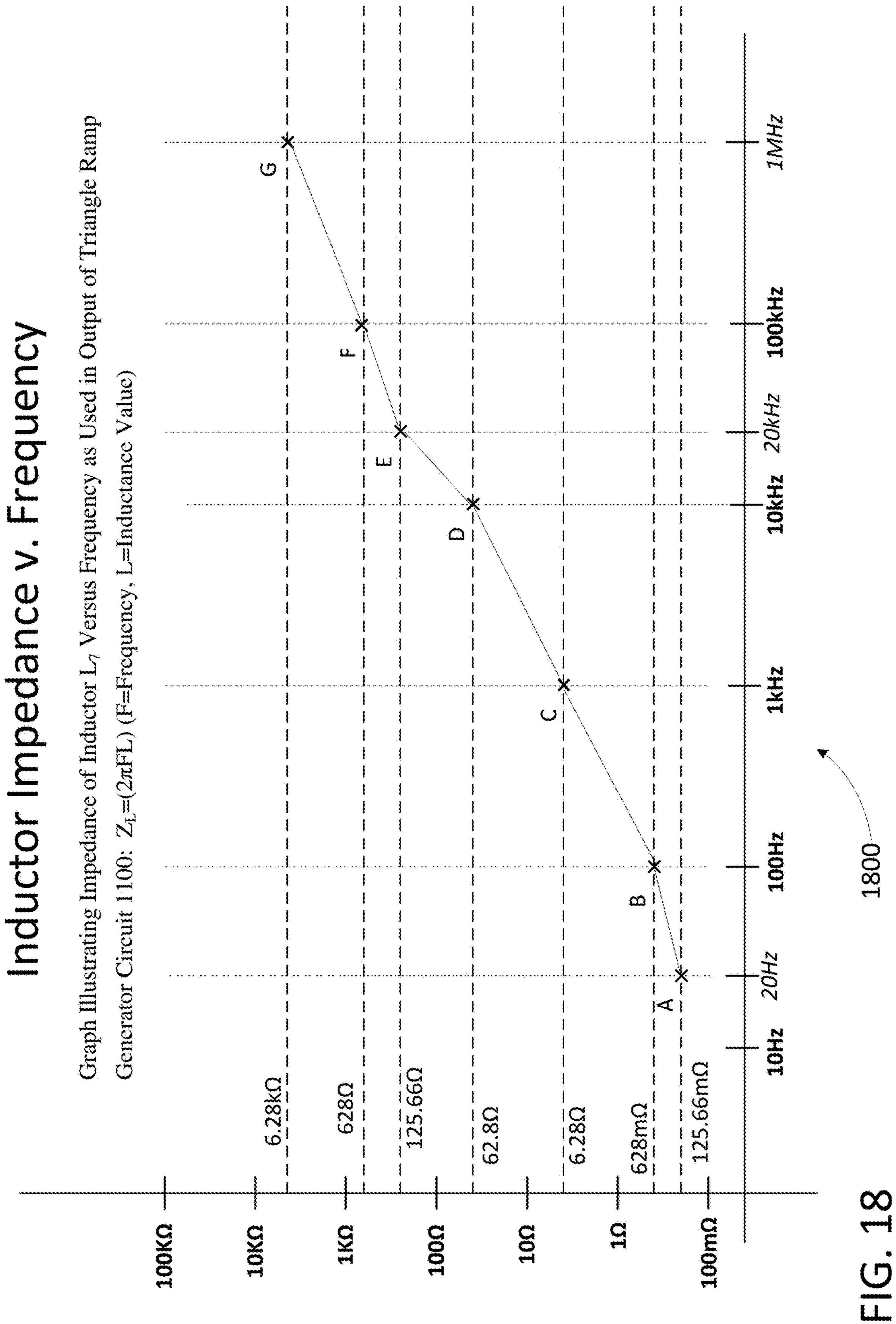
FIG. 18 illustrates a graph of inductor impedance v. frequency over a fixed frequency range in regard to an output of the triangle ramp generator circuit of FIG. 9 according to aspects of the embodiments.

In FIG. 11 there are two separate 180 pF capacitors (DC servo circuit 1100 capacitors $C_{939}$ and $C_{940}$) in parallel with inductor $L_7$ (wherein $L_7$ is about 1 mH) because 360 pF was the desired value for the ramp capacitance, and 360 pF is not available as a standard capacitor value (note that the two capacitors $C_{939}$ and $C_{940}$ are substantially similar to C312 of FIG. 3). Attention is directed towards FIG. 17, and Graph 1700, which illustrates several different calculated capacitance impedance values from 20 Hz to 1 MHZ, which facilitate operation of DC servo circuit 1100 according to aspects of the embodiments. In concert with FIG. 17 is FIG. 19, which illustrates Table 1900. Table 1900 lists calculated capacitance impedance values at several selected frequencies for the capacitors $C_{939}$ and $C_{940}$ of audio noise frequency shunt circuit 1102 according to aspects of the embodiments. Point A of Table 1900 corresponds to point A of Graph 1700, and so on for points B-G of Graph 1700. In concert with FIG. 18 is FIG. 20, which illustrates Table 2000. Table 2000 lists calculated inductance impedance values at several selected frequencies for inductor 17 of audio noise frequency shunt circuit 1102 according to aspects of the embodiments. Point A of Table 2000 corresponds to point A of Graph 1800, and so on for points B-G of Graph 1800.

At 20 Hz, 360 pF represents an impedance of 22.1 Mohm (22.1×106 ohm, or 22.1 MΩ; Point A; using $Z_c=1/(2\pi FC)$ where Zc is the impedance of the capacitor, F is the frequency of interest, and C is the capacitance value).

At 100 Hz, 360 pF represents an impedance of 4.42MΩ (4.42×106Ω) (Point B).

At 1 KHz, 360 pF represents an impedance of 442KΩ (442×103Ω) (Point C).

At 10 KHz, 360 pF represents an impedance of 44.2 KΩ (44.2×103Ω) (Point D).

At 20 KHz, 360 pF represents an impedance of 22.1 KΩ (22.1×103Ω) (Point E).

At 100 KHz, 360 pF represents an impedance of 4.42 KΩ (4.42×103Ω) (Point F).

At 1 MHz, 360 pF represents an impedance of 442Ω (Point G).

The data points above are shown in Table 1900 of FIG. 19.

In contrast, a 1 mH (1000 uH) inductor ($L_7$) presents the following impedance to noise and signal currents at the frequencies of interest:

At 20 Hz, 1000 uH represents an impedance of 125.66 mΩ (125.66×10−3Ω; Point A) (using $Z_L=2\pi FL$) where $Z_L$ is the impedance of the inductor, F is the frequency of interest and L is the inductance value).

At 100 Hz, 1000 uH represents an impedance of 628mΩ (628×10−3Ω; Point B).

At 1 KHz, 1000 uH represents an impedance of 6.28Ω (Point C).

At 10 KHz, 1000 uH represents an impedance of 62.8Ω (Point D).

At 20 KHz, 1000 uH represents an impedance of 125.66Ω (Point E).

At 100 KHz, 1000 uH represents an impedance of 628Ω (Point F).

At 1 MHz, 1000 uH represents an impedance of 6.28 KΩ (Point G).

Attention is directed to FIGS. 17 and 18, and Graphs 1700 and 1800, which illustrate the impedance versus frequency of capacitors $C_{939}$ and $C_{940}$ (in parallel), and inductor $L_7$. At 20 Hz the capacitance impedance is about 22M2 and at 20 kHz, the capacitance impedance is about 22.1 kΩ—which is a relatively high impedance over the audio bandwidth of about 20 Hz to about 20 kHz. Conversely, at 20 Hz the inductive impedance is about 125.66 mΩ and at 20 kHz the inductive impedance is about 125.66Ω. Thus, over the audio bandwidth, the added inductor $L_7$ provides a very low impedance path to ground for audio noise signals That is, the low impedance value of inductor $L_7$ essentially shunts audio frequency noise currents to ground through a low 125.66 ohm shunt impedance, substantially improving the noise performance of the triangle wave generator and the amplifier. Reference is made to FIG. 14, which illustrates a triangle wave voltage output from a simulation of operation of the circuit of FIG. 13, and hence is a simulation of operation of the circuits of FIGS. 9-12 according to aspects of the embodiments.

On the other hand, adding any non-capacitive shunt impedance to ground at the output of DC servo circuit 1100 will introduce a non-linearity into the triangle wave signal output by DC servo circuit 1100, wherein the non-linearity is generated by the fixed current sources (FIGS. 9 and 10) sourcing and sinking current into shunt circuitry 1102, comprising capacitors $C_{939}$ and $C_{940}$, and inductor $L_7$. In this example, the parallel impedance of 1000 uH inductor $L_7$ represents an impedance of 6.28 kΩ at 1 MHz. The inductive impedance should be as high as possible at the switching frequency in order to decrease the non-linearity effect of the shunt impedance. Thus, a compromise is in order, as increasing the inductance value (e.g., $L_7$) will increase the inductive impedance at the switching frequency (desirable) but will also increase the noise shunting impedance over the audio frequency range (20 Hz-20 kHz) which is undesirable. According to aspects of the embodiments, it was determined that about a 1 mH (1000 uH) inductor $L_7$ represented the best compromise in this regard.

Further, it can be appreciated, based on the discussion herein according to aspects of the embodiments, that inductor L7 provides a substantial shunt to ground (i.e., a very low impedance) for audio frequencies because of the value selected, while the capacitors $C_{939}$ and $C_{940}$ provide a relatively high impedance at audio frequencies. Similarly, while any capacitor acts in a "shunt-like" manner (low impedance) to higher frequencies—e.g., the frequence of triangle ramp output signal 1104—the values selected prevent a "total" or complete shunt to ground, but instead generate the desired peak-to-peak voltage (about 10 volts) that is required of triangle ramp output signal 1104 according to aspects of the embodiments. Further, the inductor L7 is a substantially high impedance to the frequency of triangle ramp output signal 1104. Thus, in the combination as shown in FIG. 11 the values of capacitors $C_{939}$ and $C_{940}$ and $L_7$ substantially eliminate audio noise (about 20 Hz to about 20 kHz) from triangle ramp output signal 1104 and also provide the desired peak-to-peak voltage of about 10 volts at the desired high frequency of about 1 MHz for triangle ramp output signal 1104.

As discussed above, FIG. 13 is a circuit that simulates the circuit of FIGS. 9-12, and therefore FIG. 13 is a substantially similar electrical/electronic equivalent to the combination of circuits of FIGS. 9-12. FIG. 14 illustrates a triangle wave voltage output from a simulation of operation of the circuit of FIG. 13, and hence is a simulation of operation of the circuits of FIGS. 9-12 according to aspects of the embodiments. According to further aspects of the embodiments, resistor $R_5$ in FIG. 13 is a resistor that simulates the DC resistance of inductor $L_1$ in FIG. 13.

A simulation of operation of the circuit of FIG. 13, and hence is a simulation of operation of the circuits of FIGS. 9-12 according to aspects of the embodiments. The triangle waveform shown in FIG. 14 is substantially noise free, and represents the triangle waveform detected at the location of the arrow in FIG. 13, which is the same point as "master ramp output" as seen in FIG. 11.

Figure 15:
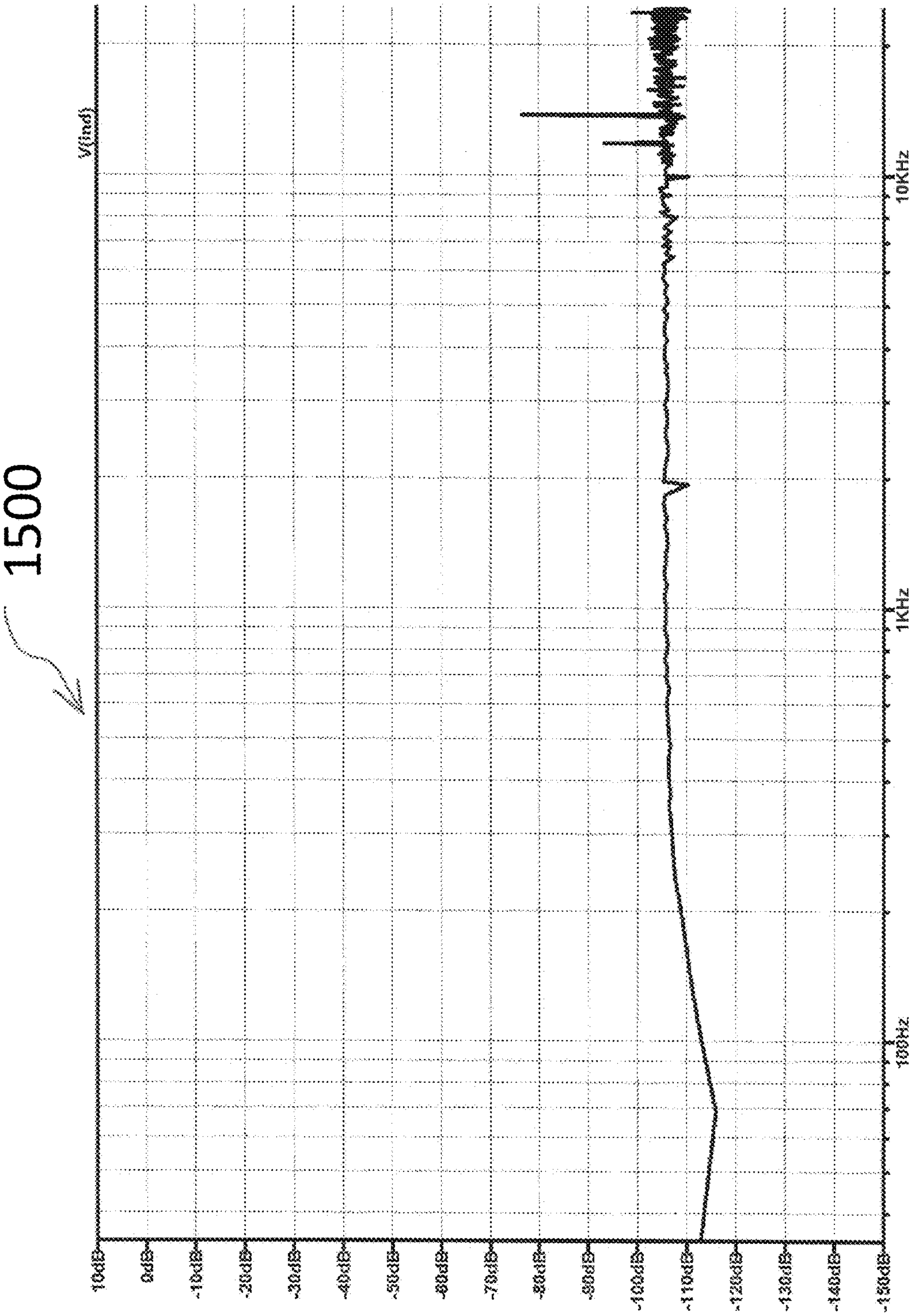
FIG. 15 illustrates a noise simulation for an output of the circuit of FIG. 13, at the location of the arrow, with inductor L1, according to aspects of the embodiments.
Figure 16:
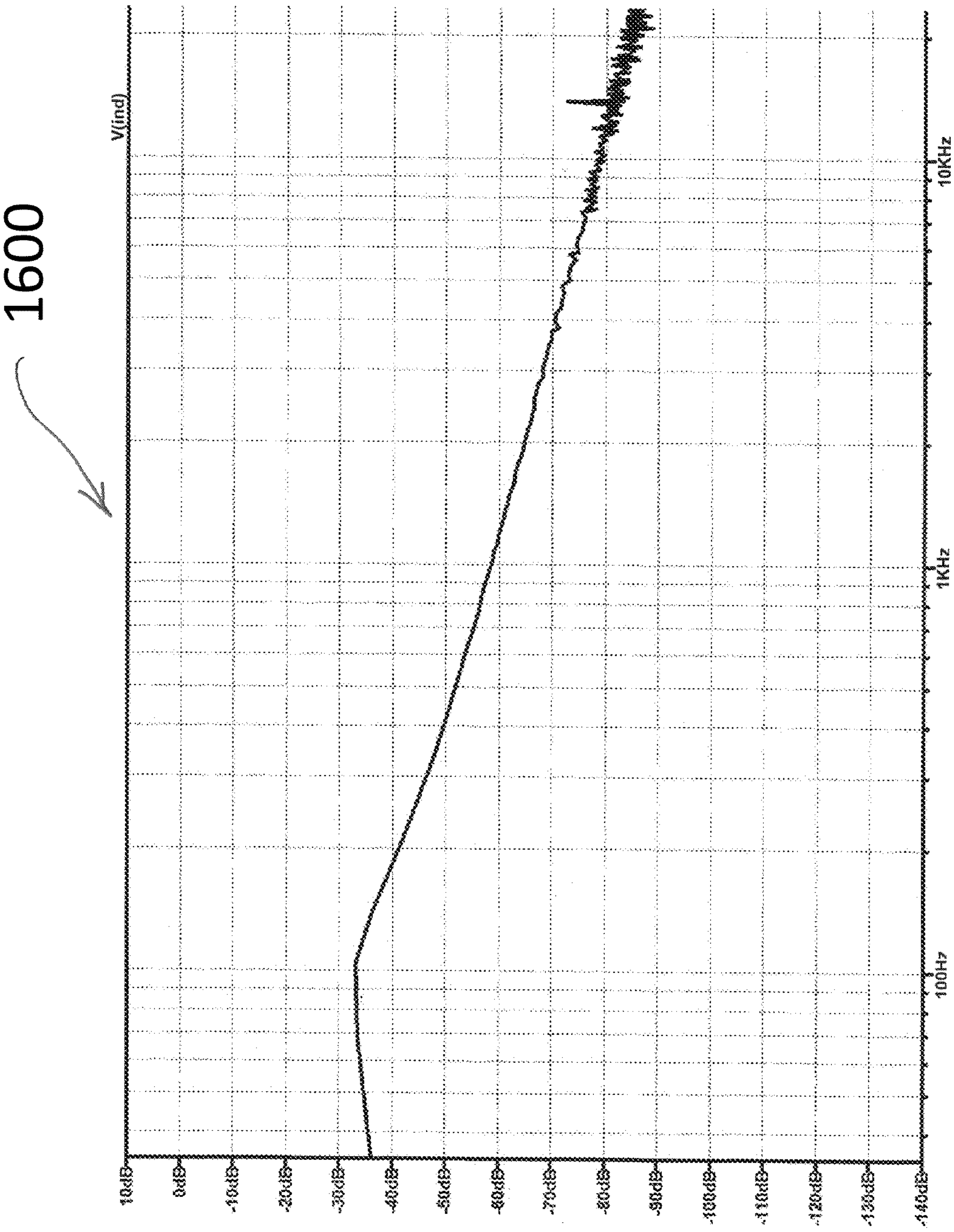
FIG. 16 illustrates a noise simulation for an output of the circuit of FIG. 13, at the location of the arrow, without inductor L1, according to aspects of the embodiments.

FIG. 15 illustrates a simulated noise spectrum 1500 of the output of simulation circuit 1300 with inductor L1 at the location of the arrow according to aspects of the embodiments. FIG. 16 illustrates a simulated noise spectrum 1600 of the output of simulation circuit 1300 without inductor L1 at the location of the arrow according to aspects of the embodiments.

From about 20 Hz to about 20 kHz, the noise level in FIG. 15 is generally about −100 dB (with inductor L1), and the noise level in FIG. 16 is generally ranges from about −40 dB to about −80 dB (no inductor L1), meaning there is far less noise in the signal that is the output of FIG. 13 at the location of the arrow in FIG. 15, than when the inductor is not present (FIG. 16).

FIG. 17 illustrates a graph of capacitor impedance v. frequency over a fixed frequency range in regard to an output of the triangle ramp generator circuit of FIG. 11 according to aspects of the embodiments; FIG. 18 illustrates a graph of a 1 mh inductor impedance v. frequency over a fixed frequency range in regard to an output of the triangle ramp generator circuit of FIG. 11 according to aspects of the embodiments; FIG. 19 illustrates a first table that lists the results for several frequencies of interest for an equation of the capacitor impedance of 360 pF as shown in FIG. 17 according to aspects of the embodiments; and FIG. 20 illustrates a second table that lists the results for several frequencies of interest for an equation of the 1 mH inductor impedance as shown in FIG. 18 according to aspects of the embodiments. The disclosed embodiments provide a system, method, and mode for operating an advanced Class D amplifier 400 according to aspects of the embodiments, wherein crosstalk noise is substantially reduced or eliminated, and mismatching speaker loads with respect to output power is substantially prevented. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

INDUSTRIAL APPLICABILITY

To solve the aforementioned problems, aspects of the embodiments provide a unique device in which a substantially noise-free triangle waveform signal is generated for use in one or more audio channels of a Class D amplifier, and additional circuitry is further provided to substantially minimize or prevent the possibility of mismatching an output load impedance with regard to a rated power output of the Class D amplifier, thereby substantially preventing or minimizing the possibility of damaging the output stages of the Class D amplifier.

ALTERNATE EMBODIMENTS

Alternate embodiments may be devised without departing from the spirit or the scope of the invention. For example, the switched current sources which source or sink current to the timing capacitors may be located in a single central position on the PCB of the audio amplifier operating as a central current generator circuit block and current mirrors may operate remotely to generate triangle ramp output signal 1104 in each individual amplifier channel.

What is claimed is:

1. A triangle wave generator circuit for use with a class D amplifier, the triangle wave generator circuit adapted to generate and output a triangle wave signal and comprising:

a clock generating circuit adapted to provide a timing signal that generates a period of the output triangle wave;

a first current source adapted to provide a first source current at a first magnitude;

a first current sink adapted to sink a first sink current at about two times the first magnitude;

a DC servo circuit adapted to adjust the first magnitude of the first source current based on a direct current (DC) voltage present in the output triangle wave signal so that the DC voltage on the output triangle wave signal is substantially eliminated; and an output filter circuit adapted to substantially reduce audio frequency noise in the output triangle wave, and generate the output triangle wave signal at a desired peak-to-peak voltage level based on the first source current and first sink current.

2. The triangle wave generator circuit according to claim 1, wherein the output filter comprises:

a capacitor with a first capacitor value that generates the output triangle wave signal at a desired peak-to-peak voltage level based on the first source current and first sink current; and an inductor with a first inductance value presenting a low impedance at audio frequencies while presenting a high impedance at the frequency of the output triangle wave signal that substantially shunts audio frequency noise to ground.

* * * * *